(12) United States Patent
Ke

(10) Patent No.: US 7,015,742 B2
(45) Date of Patent: Mar. 21, 2006

(54) SWITCHED CAPACITOR CIRCUIT CAPABLE OF ELIMINATING CLOCK FEEDTHROUGH BY COMPLEMENTARY CONTROL SIGNALS FOR DIGITAL TUNING VCO

(75) Inventor: Ling-Wei Ke, Hsin-Chu Hsien (TW)

(73) Assignee: Media Tek Inc., Hsin-Chu (TW)

( * ) Notice: Subject to any disclaimer, the term of this patent is extended or adjusted under 35 U.S.C. 154(b) by 108 days.

(21) Appl. No.: 10/250,285

(22) Filed: Jun. 20, 2003

(65) Prior Publication Data

US 2004/0257143 A1 Dec. 23, 2004

(51) Int. Cl.
*G06F 7/64* (2006.01)

(52) U.S. Cl. .................................... 327/337; 331/36 C
(58) Field of Classification Search ................. 327/337, 327/403, 404; 331/8, 16–17, 34, 36 C
See application file for complete search history.

(56) References Cited

U.S. PATENT DOCUMENTS

| | | | |
|---|---|---|---|
| 3,909,748 A | 9/1975 | Yuan | |
| 4,404,525 A * | 9/1983 | Amir et al. .................. 330/9 |
| 4,455,539 A * | 6/1984 | Wurzburg ................... 333/173 |
| 4,602,222 A | 7/1986 | Wynn | |
| 4,697,152 A * | 9/1987 | Westwick .................. 330/9 |
| 4,713,631 A | 12/1987 | Enderby | |
| 4,716,319 A * | 12/1987 | Rebeschini ................. 327/554 |
| 4,829,268 A * | 5/1989 | Leuthold et al. ........... 331/17 |
| 5,625,325 A | 4/1997 | Rotzoll | |
| 5,686,864 A | 11/1997 | Martin | |
| 5,739,730 A | 4/1998 | Rotzoll | |
| 5,745,012 A | 4/1998 | Oka | |
| 5,898,345 A | 4/1999 | Namura | |
| 5,912,632 A | 6/1999 | Dieska | |
| 5,936,474 A | 8/1999 | Rousselin | |
| 6,147,567 A | 11/2000 | Welland | |
| 6,226,506 B1 | 5/2001 | Welland | |
| 6,323,736 B1 | 11/2001 | Jansson | |
| 6,518,901 B1 * | 2/2003 | Pinna et al. ................ 341/122 |
| 6,587,144 B1 * | 7/2003 | Kim ........................... 348/241 |
| 6,633,202 B1 * | 10/2003 | Yang et al. ................. 331/57 |
| 6,815,996 B1 * | 11/2004 | Hsiao ......................... 327/337 |

* cited by examiner

*Primary Examiner*—Timothy P. Callahan
*Assistant Examiner*—Cassandra Cox
(74) *Attorney, Agent, or Firm*—Winston Hsu

(57) ABSTRACT

A differential switched capacitor circuit for use in a voltage controlled oscillator (VCO) capable of eliminating clock feedthrough and preventing an unwanted momentary frequency shift and drift in the VCO output frequency when the switched capacitor circuit is shut off. A center switch element connects a positive side capacitance node with a negative side capacitance node depending on a first control signal. A positive side primary switch element and a negative side primary switch element connect the positive and negative side capacitance nodes depending on the first control signal. A positive side additional switch element and negative side additional switch element with control signals complementary to the first control signal cancel the clock feedthrough of the center switch and the positive and negative side primary switch elements at the positive and negative side capacitance nodes respectively.

30 Claims, 25 Drawing Sheets

SWITCHED CAPACITOR CIRCUIT CAPABLE OF ELIMINATING CLOCK FEEDTHROUGH BY COMPLEMENTARY CONTROL SIGNALS FOR DIGITAL TUNING VCO

BACKGROUND OF INVENTION

1. Field of the Invention

The present invention relates to a switched capacitor circuit, and more particularly, to a switched capacitor circuit for use in a voltage controlled oscillator (VCO) that eliminates the clock feedthrough effect thereby preventing a momentary VCO frequency shift and drift when the switched capacitor circuit is switched on or off.

2. Description of the Prior Art

A voltage controlled oscillator (VCO) is commonly used for frequency synthesis in wireless communication circuits. As Welland, et al. state in U.S. Pat. Nos. 6,226,506 and 6,147,567, wireless communication systems typically require frequency synthesis in both the receive path circuitry and the transmit path circuitry.

FIG. 1 shows a VCO circuit with digital tuning according to the prior art. A VCO 10 used in a frequency synthesizer solution is typically based on a resonant structure. Ceramic resonators and LC tank circuits are common examples. While details in the implementation of LC tank oscillators differ, the basic resonant structure includes an inductor 12 connected between a first oscillator node OSC_P and a second oscillator node OSC_N. Connected in parallel with the inductor 12 is a continuously variable capacitor 14 as the varactor and a plurality of discretely variable capacitors 16. The continuously variable capacitor 14 is used for fine-tuning the desired capacitance while the plurality of discretely variable capacitors 16 is used for coarse tuning. The resistive loss of the parallel combination of an inductor and capacitors is compensated by a negative resistance generator 18 to sustain the oscillation.

Each discretely variable capacitor in the plurality of discretely variable capacitors 16 is made up of a switched capacitor circuit 20 and each switched capacitor circuit is controlled by an independent control signal 22. Based on this control signal 22 the switched capacitor circuit 20 can selectively connect or disconnect a capacitance 24 to the resonator of the VCO 10. Different on/off combinations of switched capacitor arrays result in a wider capacitance range of the LC type resonator and hence a wider VCO 10 oscillation frequency coverage.

FIG. 2 shows a single ended switched capacitor circuit 30 according to the prior art. A capacitor 32 is connected between the first oscillator node OSC_P and a node A. A switch element 34 having an NMOS transistor selectively connects node A to the second oscillator node OSC_N that is connected to ground, and the switch element 34 is controlled by a control signal SW. When the switch element 34 is turned on, the capacitance associated with the capacitor 32 is added to the overall capacitance in the VCO 10 resonator. When the switch element 34 is turned off the capacitance looking into the first oscillator node OSC_P is the series combination of the capacitor 32 and the off state capacitance associated with the switch element 34.

FIG. 3 shows another prior art switched capacitor circuit 40, which is a differential implementation without a center switch. Differential implementations have much greater common-mode noise rejection and are widely used in high-speed integrated circuit environments. In the differential without center switch switched capacitor circuit 40, a positive side capacitor 42 is connected between the first oscillator node OSC_P and a node A. A positive side switch element 46 having an NMOS transistor selectively connects node A to ground. A negative side capacitor 44 is connected between the second oscillator node OSC_N and a node B. A negative side switch element 48 having an NMOS transistor selectively connects node B to ground. The two switch elements 46, 48 are controlled by the same control signal SW. When the switch elements are turned on, the capacitance associated with the series combination of the positive and negative side capacitors 42, 44 is added to the overall capacitance in the VCO 10 resonator. When the switch elements 46, 48 are turned off, the differential capacitance between the oscillator nodes OSC_P and OSC_N is the combination of the positive and negative side capacitors 42, 44 and the parasitic capacitance of the off state switch elements in the VCO 10 resonator.

FIG. 4 shows a prior art switched capacitor circuit 60, which is a differential implementation with a center switch. In the differential with center switch switched capacitor circuit 60, a positive side capacitor 62 is connected between the first oscillator node OSC_P and a node A. A positive side switch element 68 having an NMOS transistor selectively connects node A to ground. A negative side capacitor 66 is connected between the second oscillator node OSC_N and a node B. A negative side switch element 70 having an NMOS transistor selectively connects node B to ground. There is also a center switch element 64 having an NMOS transistor used to lower the overall turn-on switch resistance connected between node A and node B. All three switch elements 64, 68, 70 are controlled by the same control signal SW. When the switch elements 64, 68, 70 are turned on, the capacitance associated with the series combination of the positive and negative side capacitors 62, 66 is added to the overall capacitance in the VCO 10 resonator. When the switch elements 64, 68, 70 are turned off, the differential capacitance between the oscillator nodes OSC_P and OSC_N is the combination of the positive and negative side capacitors 62, 66 and the parasitic capacitance of the off state switch elements in the VCO 10 resonator.

FIG. 5 shows a prior art switched capacitor circuit 90, which is a differential implementation with only a center switch. In the differential only center switch switched capacitor circuit 90, a positive side capacitor 92 is connected between the first oscillator node OSC_P and a node A. A negative side capacitor 96 is connected between the second oscillator node OSC_N and a node B. There is a center switch element 94 having an NMOS transistor used to lower the turn-on switch resistance connected between the node A and node B. The switch element 94 is controlled by the control signal SW. When the switch element 94 is turned on, the capacitance associated with the series combination of the positive and negative side capacitors 92, 96 is added to the overall capacitance in the VCO 10 resonator. When the switch element 94 is turned off, the differential capacitance between the oscillator nodes OSC_P and OSC_N is the combination of the positive and negative side capacitors 92, 96 and the parasitic capacitance of the off state switch elements in the VCO 10 resonator.

Regardless of whether the single ended implementation shown in FIG. 2 or the differential implementation shown in FIG. 3, FIG. 4 and FIG. 5 is used, when the switched capacitor circuit 30, 40, 60, or 90 is turned off, a momentary voltage step occurs at node A (and in the case of the differential implementation shown in FIG. 3, FIG. 4 and FIG. 5 also at node B). The momentary voltage step causes an unwanted change in the overall capacitance that is contributed from switches and parasitic diodes of switches, and ultimately, an unwanted change in the VCO 10 frequency. This momentary voltage step could be a voltage drop or rise depending on whether the switch elements are turned off or on with a logic low signal or a logic high signal respectively.

Using the single ended case shown in FIG. 2 as an example, when the switch element 34 is turned off, charge carriers are injected towards the impedances connected to the first terminal and the second terminal of the switch element 34. The injection produces an undesired voltage step across the capacitive impedance and appears as a voltage step at node A. This effect is known as clock feedthrough effect (or simply called "clock feedthrough") and appears as a feedthrough of the control signal SW from the control terminal of the switch element 34 to the first and second terminals of the switch element 34. When the switch element 34 is turned on, node A is connected to ground so the feedthrough of the control signal SW is of no consequence. However, when the switch element 34 is turned off, the feedthrough of the control signal SW causes a voltage step, in the form of a voltage drop to appear at node A. Because of the dropped voltage at node A, the floating parasitic diode formed by the N+ diffusion of NMOS switch element 34 and the P type substrate in the off state will be slightly forward biased. The voltage level at node A will spike low and then recover to ground potential as the forward biased junction diode formed by the switch element 34 in the off state allows current to flow. The voltage step and recovery at node A changes the capacitance of the VCO 10 resonator and causes an unwanted momentarily shift and drift in the VCO 10 frequency.

When the differential switched capacitor circuits 40, 60 and 90, shown in FIG. 3, FIG. 4, and FIG. 5 respectively, switch off, they with the floating parasitic diodes suffer from the same clock feedthrough problem at node A and at node B. Using the differential with center switch switched capacitor circuit 60 shown in FIG. 4 as an example, the positive side node A has an unwanted voltage step caused by the clock feedthrough of both the positive side switch element 68 and the clock feedthrough of the center switch element 64. Similarly, the negative side node B has an unwanted voltage step caused by the clock feedthrough of both the negative side switch element 70 and the clock feedthrough of the center switch element 64. The voltage step and recovery at node A and node B changes the capacitance of the VCO 10 resonator and causes an unwanted momentary shift and drift in the VCO 10 frequency.

SUMMARY OF INVENTION

It is therefore a primary objective of the present invention to provide a switched capacitor circuit capable of eliminating clock feedthrough by complementary control signals, to solve the above-mentioned problem for digital tuning VCOs.

According to the present invention, a single-ended switched capacitor circuit capable of eliminating clock feedthrough by using a dummy switch that is specified of adequate size. A control signal generator generates a first control signal and a second control signal, wherein the second control signal is complementary to the first control signal. A switch element selectively connects a terminal node to a capacitance depending on the first control signal. A dummy switch element selectively connects to the terminal node depending on the second control signal.

According to the present invention, a differential switched capacitor circuit capable of eliminating clock feedthrough by using dummy switches that are specified of adequate size. A control signal generator generates a first control signal and a second control signal, wherein the second control signal is complementary to the first control signal. A center switch element selectively connects a positive side capacitance to a negative side capacitance depending upon the first control signal. A positive side dummy switch element selectively connects to a positive side node of the center switch element depending upon the second control signal. A negative side dummy switch element selectively connects the to a negative side node of the center switch element depending on the second control signal.

According to the present invention, a single-ended switched capacitor circuit capable of eliminating clock feedthrough by using a complementary switch that is specified of adequate size. A control signal generator generates a first control signal and a second control signal, wherein the second control signal is complementary to the first control signal. A switch element selectively connects a terminal node to a capacitance depending on the first control signal. A complementary switch element selectively connects to the terminal nodes of the switch element depending on the second control signal.

According to the present invention, a differential switched capacitor circuit capable of eliminating clock feedthrough by using complementary switches that are specified of adequate size. A control signal generator generates a first control signal and a second control signal, wherein the second control signal is complementary to the first control signal. A center switch element selectively connects a positive side capacitance to a negative side capacitance depending upon the first control signal. A complementary switch element selectively connects to the terminal nodes of the center switch element depending upon the second control signal.

It is an advantage of the present invention that the clock feedthrough produced at the capacitance node by the switch element is cancelled by the complementary clock feedthrough produced by the dummy switch element or the complementary switch element with a complementary control signal. A switched capacitor circuit of the present invention for use in a voltage controlled oscillator (VCO) capable of eliminating clock feedthrough by complementary control signals and preventing an unwanted momentary frequency shift and drift phenomenon in the VCO output frequency when the switched capacitor circuit is switched on or off.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
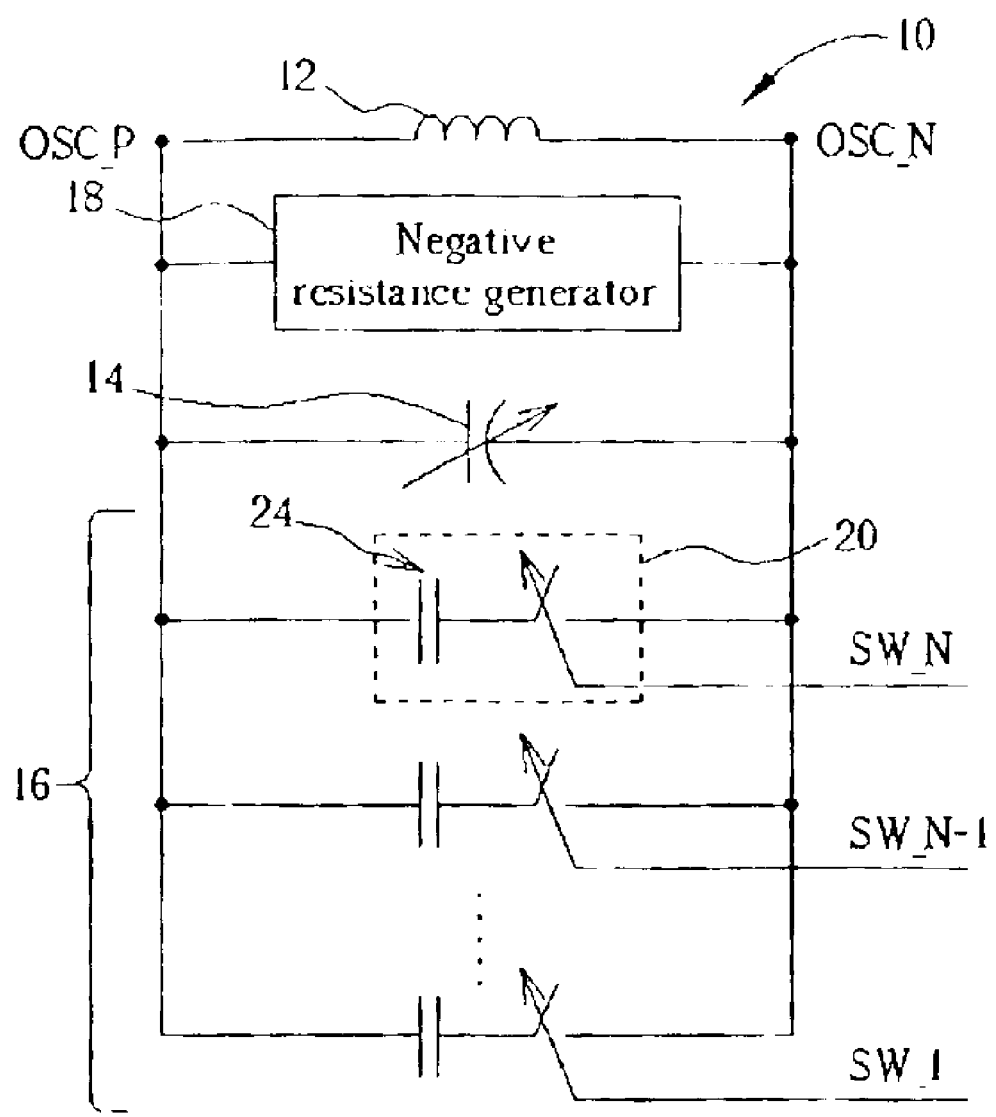
FIG. 1 is a schematic diagram of a typical Voltage Controlled Oscillator (VCO) circuit with switched capacitor circuits used in a frequency synthesizer according to the prior art.
Figure 2:
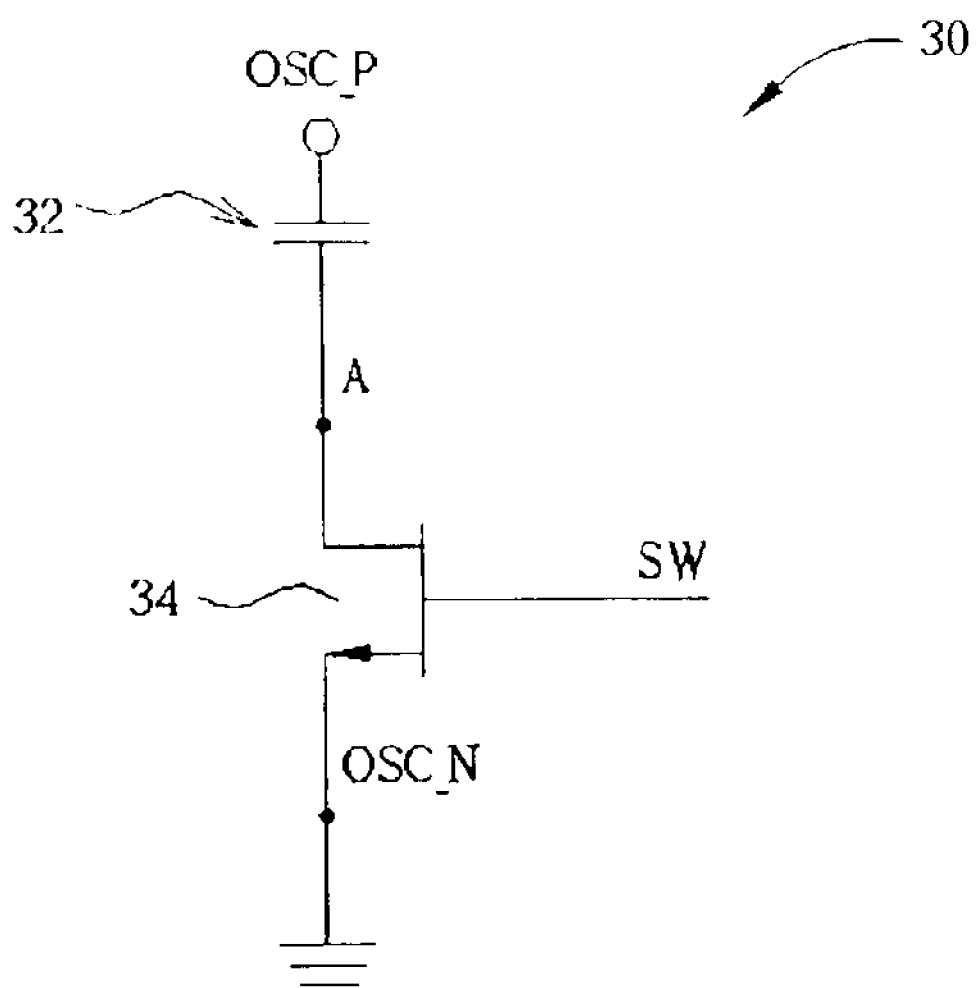
FIG. 2 shows a single ended switched capacitor circuit used in the VCO of FIG. 1 according to the prior art.
Figure 3:
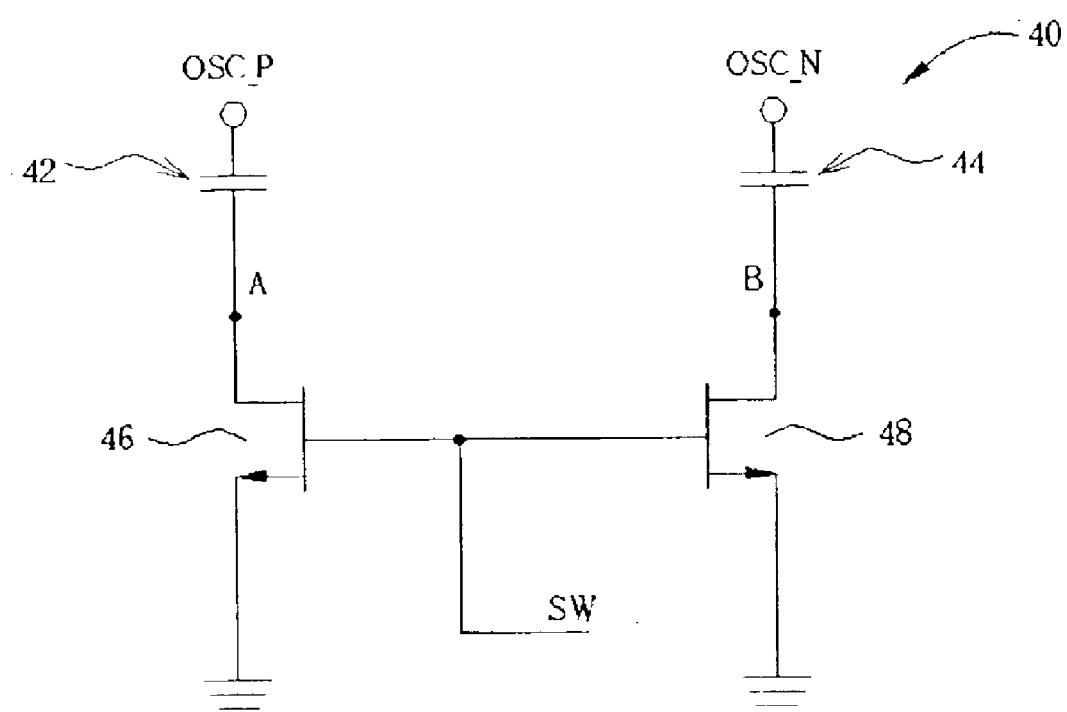
FIG. 3 shows a differential without center switch switched capacitor circuit used in the VCO of FIG. 1 according to the prior art.
Figure 4:
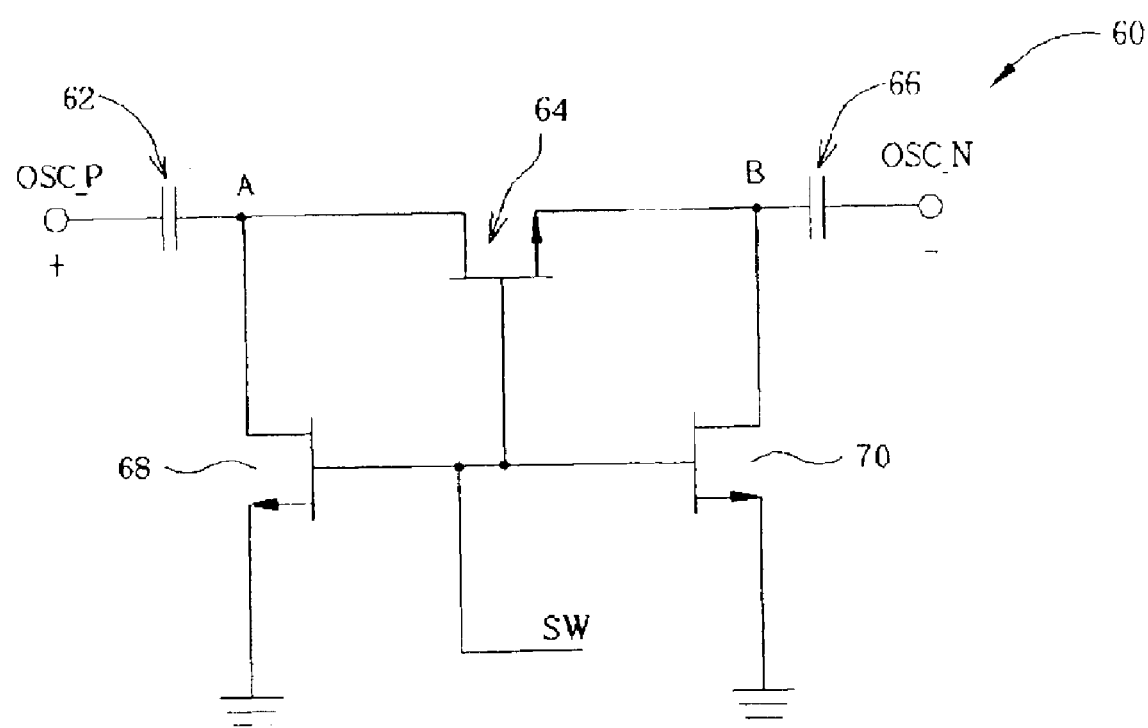
FIG. 4 shows a differential with center switch switched capacitor circuit used in the VCO of FIG. 1 according to the prior art.
Figure 5:
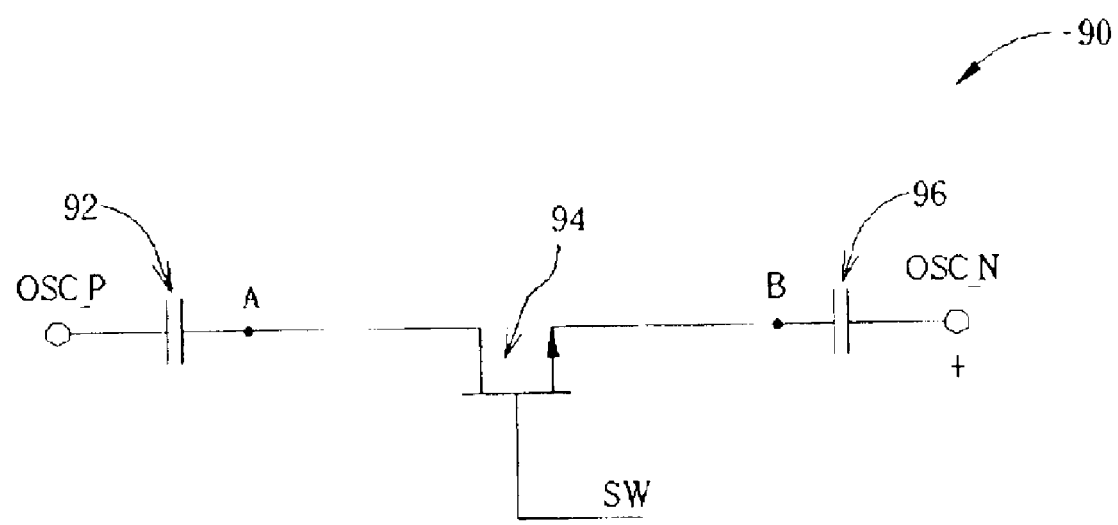
FIG. 5 shows a differential only center switch switched capacitor circuit used in the VCO of FIG. 1 according to the prior art.
Figure 6:
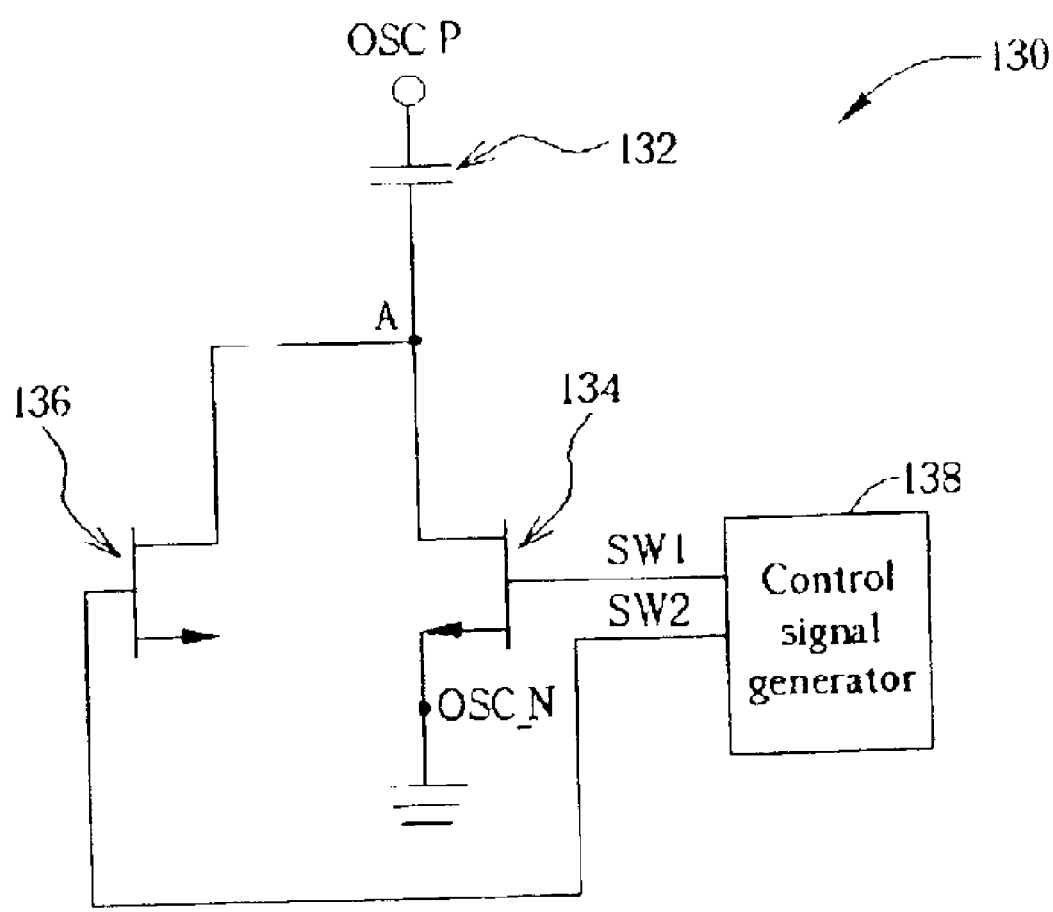
FIG. 6 shows the first embodiment of the present invention for a single ended switched capacitor circuit.

FIG. 6 shows a single ended switched capacitor circuit 130 according to the first embodiment of the present invention. In the first embodiment, the singled ended switched capacitor circuit 130 includes a capacitor 132, a primary switch element 134 having an NMOS transistor, a dummy switch element 136 having an NMOS transistor, and a control signal generator 138.

Figure 7:
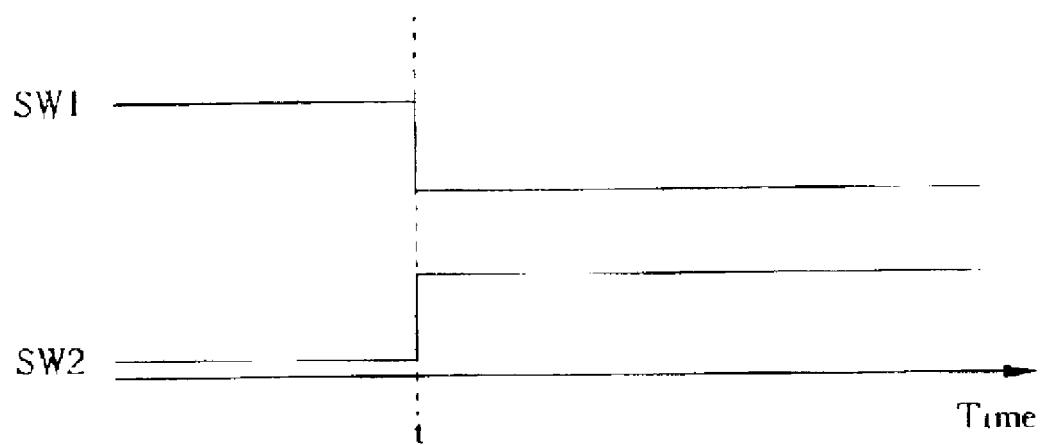
FIG. 7 shows a signal diagram of the first control signal and the second control signal generated by the control signal generator in FIG. 6.

FIG. 7 shows a signal diagram of a first control signal SW1 and a second control signal SW2 generated by the control signal generator 138. The control signal generator 138 provides the first control signal SW1 and the first control signal SW2, wherein the second control signal SW2 is complementary to the first control signal SW1. At time t, the switched capacitor switch 130 is switched off and, as shown in FIG. 7, the second control signal SW2 is complementary to the first control signal SW1.

In FIG. 6, the capacitor 132 is connected between the first oscillator node OSC_P and a node A. The primary switch element 134 selectively connects node A to ground based on the first control signal SW1. The dummy switch element 136 has a first terminal connected to node A, a control terminal connected to the second control signal SW2, and a second terminal left unconnected.

The clock feedthrough at node A has two sources: the clock feedthrough from the primary switch element 134 and the clock feedthrough from the dummy switch element 136. Because the primary switch element 134 is controlled by the first control signal SW1, the clock feedthrough produced at node A due to switch element 134 will be opposite in polarity to the clock feedthrough produced at node A due to the dummy switch element 136, which is controlled by the second control signal SW2. One property of clock feedthrough is that the larger the switch element the larger the voltage step at the capacitance node when the switch element is switched to the off state. By properly sizing the dummy switch element 136 such that the voltage step caused by the switch element 136 is of equal magnitude (but opposite polarity) as the clock feedthrough caused by the switch element 134, the unwanted voltage step at node A is eliminated.

Figure 8:
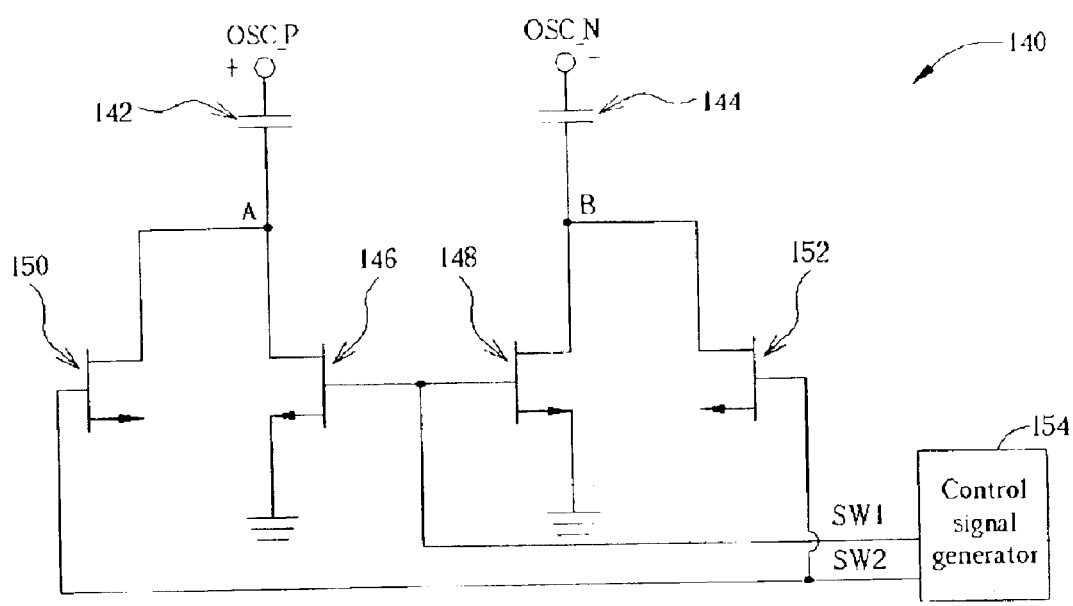
FIG. 8 shows the first embodiment of the present invention for a differential without center switch switched capacitor circuit.

FIG. 8 shows a differential without center switch switched capacitor circuit 140 according to the first embodiment of the present invention. In the first embodiment, the differential without center switch switched capacitor circuit 140 includes a positive side capacitor 142, a negative side capacitor 144, a positive side primary switch element 146 having an NMOS transistor, a negative side primary switch element 148 having an NMOS transistor, a positive side dummy switch element 150 having an NMOS transistor, a negative side dummy switch element 152 having an NMOS transistor, and a control signal generator 154.

The positive side capacitor 142 is connected between the first oscillator node OSC_P and a node A, and the negative side capacitor 144 is connected between the second oscillator node OSC_N and a node B. The control signal generator 154 provides a first control signal SW1, and a second control signal SW2 that is complementary to the first control signal SW1. The signal diagram for the first control signal SW1 and the second control signal SW2 is the same as that shown in FIG. 7. The positive side primary switch element 146 selectively connects node A to ground based on the first control signal SW1 and the negative side primary switch element 148 selectively connects node B to ground based on the first control signal SW1. The positive side dummy switch element 150 has a first terminal connected to node A, a control terminal connected to the second control signal SW2, and a second terminal left unconnected. The negative side dummy switch element 152 has a first terminal connected to node B, a control terminal connected to the second control signal SW2, and a second terminal left unconnected.

The clock feedthrough at node A has two sources: the clock feedthrough from the positive side primary switch element 146 and the clock feedthrough from the positive side dummy switch element 150. Because the positive side primary switch element 146 is controlled by the first control signal SW1, the clock feedthrough produced at node A due to the switch element 146 will be opposite in polarity to the clock feedthrough produced at node A due to the positive side dummy switch element 150, which is controlled by the second control signal SW2. By properly sizing the positive side dummy switch element 150 such that the voltage step caused by the switch element 150 is of equal magnitude (but opposite polarity) as the clock feedthrough caused by the switch element 146, the unwanted voltage step at node A is eliminated.

Similarly, the clock feedthrough at node B has two sources: the clock feedthrough from the negative side primary switch element 148 and the clock feedthrough from the negative side dummy switch element 152. Because the negative side primary switch element 148 is controlled by the first control signal SW1, the clock feedthrough produced at node B due to the switch element 148 will be opposite in polarity to the clock feedthrough produced at node B due to the negative side dummy switch element 152, which is controlled by the second control signal SW2. By properly sizing the negative side dummy switch element 152 such that the voltage step caused by the switch element 152 is of equal magnitude (but opposite polarity) as the clock feedthrough caused by the switch element 148, the unwanted voltage step at node B is eliminated. Because the clock feedthrough at node A and node B is eliminated, so is the unwanted momentary capacitance change and associated frequency shift and drift in the VCO 10.

Figure 9:
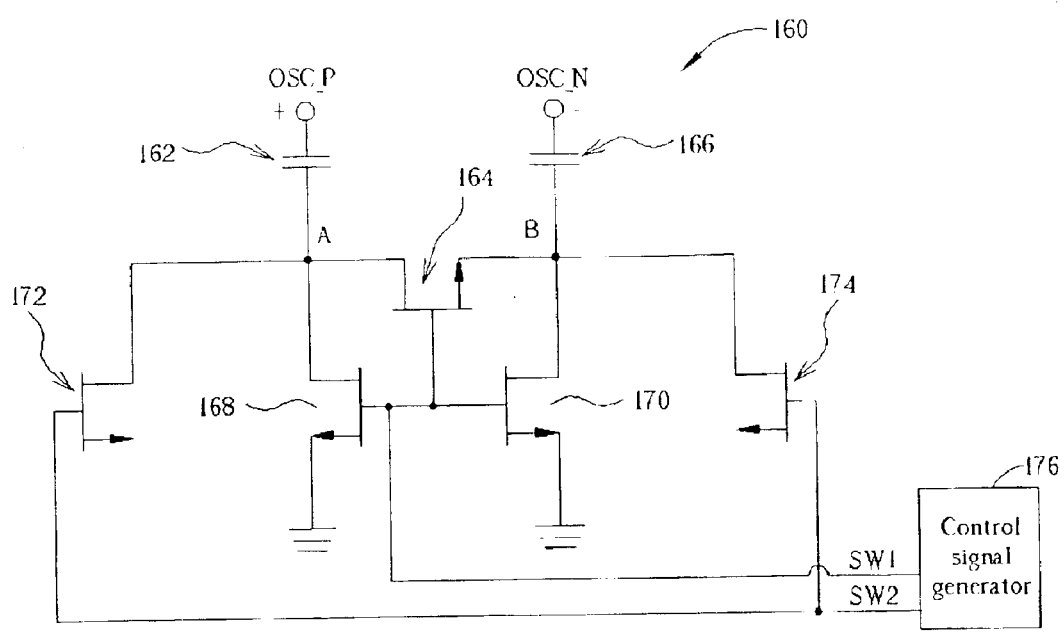
FIG. 9 shows the first embodiment of the present invention for a differential with center switch switched capacitor circuit.

FIG. 9 shows a differential with center switch switched capacitor circuit 160 according to the first embodiment of the present invention. In the first embodiment, the differential with center switch switched capacitor circuit 160 includes a positive side capacitor 162, a negative side capacitor 166, a center switch element 164 having an NMOS transistor, a positive side primary switch element 168 having an NMOS transistor, a negative side primary switch element 170 having an NMOS transistor, a positive side dummy switch element 172 having an NMOS transistor, a negative side dummy switch element 174 having an NMOS transistor, and a control signal generator 176.

The positive side capacitor 162 is connected between the first oscillator node OSC_P and a node A, and the negative side capacitor 166 is connected between the second oscillator node OSC_N and a node B. The control signal generator 176 provides a first control signal SW1, and a second control signal SW2 that is complementary to the first control signal SW1. The signal diagram for the first control signal SW1 and the second control signal SW2 is the same as that shown in FIG. 7. The center switch element 164 selectively connects node A to node B depending on the first control signal SW1. The positive side primary switch element 168 selectively connects node A to ground based on the first control signal SW1, and the negative side primary switch element 170 selectively connects node B to ground based on the first control signal SW1. The positive side dummy switch element 172 has a first terminal connected to node A, a control terminal connected to the second control signal SW2, and a second terminal left unconnected. The negative side dummy switch element 174 has a first terminal connected to node B, a control terminal connected to the second control signal SW2, and a second terminal left unconnected.

The clock feedthrough at node A has three sources: the clock feedthrough from the center switch element 164, the clock feedthrough from the positive side primary switch element 168, and the clock feedthrough from the positive side dummy switch element 172. Because the center switch element 164 and the positive side primary switch element 168 are controlled by the first control signal SW1, the clock feedthrough produced at node A due to these two switch elements 164, 168 will be opposite in polarity to the clock feedthrough produced at node A due to the positive side dummy switch element 172, which is controlled by the second control signal SW2. By properly sizing the positive side dummy switch element 172 such that the voltage step caused by the switch element 172 is of equal magnitude (but opposite polarity) as the combined clock feedthrough caused by the switch elements 164 and 168, the unwanted voltage step at node A is eliminated.

Similarly, the clock feedthrough at node B has three sources: the clock feedthrough from the center switch element 164, the clock feedthrough from the negative side primary switch element 170, and the clock feedthrough from the negative side dummy switch element 174. Because the center switch element 164 and the negative side primary switch element 170 are controlled by the first control signal SW1, the clock feedthrough produced at node B due to these two switch elements 164, 170 will be opposite in polarity to the clock feedthrough produced at node B due to the negative side dummy switch element 174, which is controlled by the second control signal SW2. By properly sizing the negative side dummy switch element 174 such that the voltage step caused by the switch element 174 is of equal magnitude (but opposite polarity) as the combined clock feedthrough caused by the switch elements 164 and 170, the unwanted voltage step at node B is eliminated. Because the clock feedthrough at node A and node B is eliminated, so is the unwanted momentary capacitance change and associated frequency shift and drift in the VCO 10.

Figure 10:
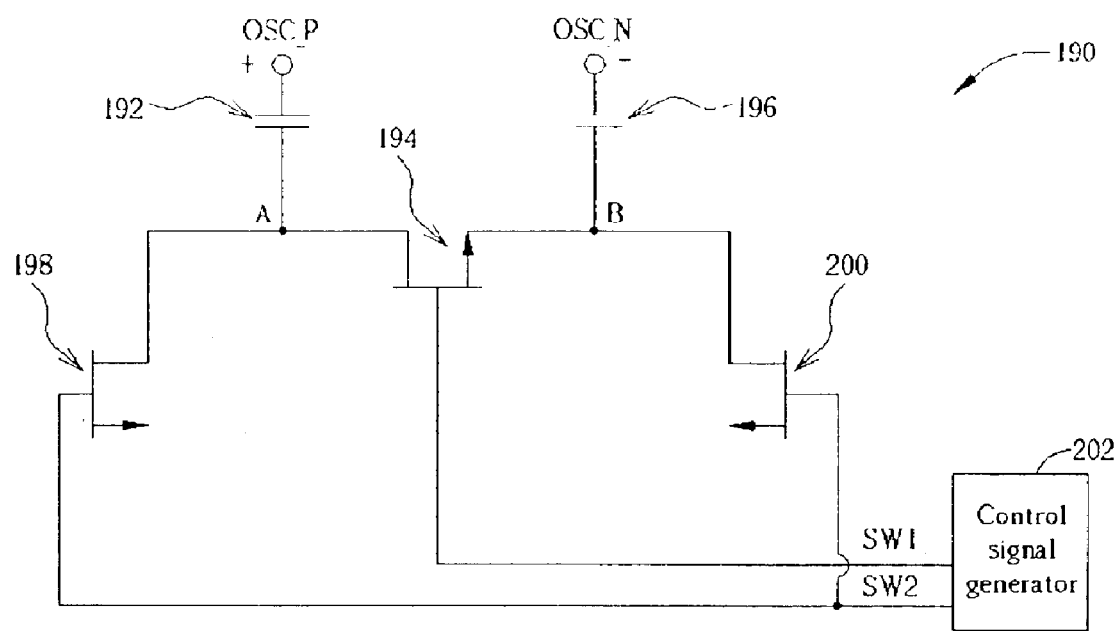
FIG. 10 shows the first embodiment of the present invention for a differential only center switch switched capacitor circuit.

FIG. 10 shows a differential only center switch switched capacitor circuit 190 according to the first embodiment of the present invention. In the first embodiment, the differential only center switch switched capacitor circuit 190 includes a positive side capacitor 192, a negative side capacitor 196, a center switch element 194 having an NMOS transistor, a positive side dummy switch element 198 having an NMOS transistor, a negative side dummy switch element 200 having an NMOS transistor, and a control signal generator 202.

The positive side capacitor 192 is connected between the first oscillator node OSC_P and a node A, and the negative side capacitor 196 is connected between the second oscillator node OSC_N and a node B. The control signal generator 202 provides a first control signal SW1, and a second control signal SW2 that is complementary to the first control signal SW1. The signal diagram for the first control signal SW1 and the second control signal SW2 is the same as that shown in FIG. 7. The center switch element 194 selectively connects node A to node B depending on the first control signal SW1. The positive side dummy switch element 198 has a first terminal connected to node A, a control terminal connected to the second control signal SW2, and a second terminal left unconnected. The negative side dummy switch element 200 has a first terminal connected to node B, a control terminal connected to the second control signal SW2, and a second terminal left unconnected.

The clock feedthrough at node A has two sources: the clock feedthrough from the center switch element 194 and the clock feedthrough from the positive side dummy switch element 198. Because the center switch element 194 is controlled by the first control signal SW1, the clock feedthrough produced at node A due to the switch element 194 will be opposite in polarity to the clock feedthrough produced at node A due to the positive side dummy switch element 198, which is controlled by the second control signal SW2. By properly sizing the positive side dummy switch element 198 such that the voltage step caused by the switch element 198 is of equal magnitude (but opposite polarity) as the combined clock feedthrough caused by the switch element 194, the unwanted voltage step at node A is eliminated.

Similarly, the clock feedthrough at node B has two sources: the clock feedthrough from the center switch element 194 and the clock feedthrough from the negative side dummy switch element 200. Because the center switch element 194 is controlled by the first control signal SW1, the clock feedthrough produced at node B due to the switch element 194 will be opposite in polarity to the clock feedthrough produced at node B due to the negative side dummy switch element 200, which is controlled by the second control signal SW2. By properly sizing the negative side dummy switch element 200 such that the voltage step caused by the switch element 200 is of equal magnitude (but opposite polarity) as the combined clock feedthrough caused by the switch element 194, the unwanted voltage step at node B is eliminated. Because the clock feedthrough at node A and node B is eliminated, so is the unwanted momentary capacitance change and associated frequency shift and drift in the VCO 10.

Figure 11:
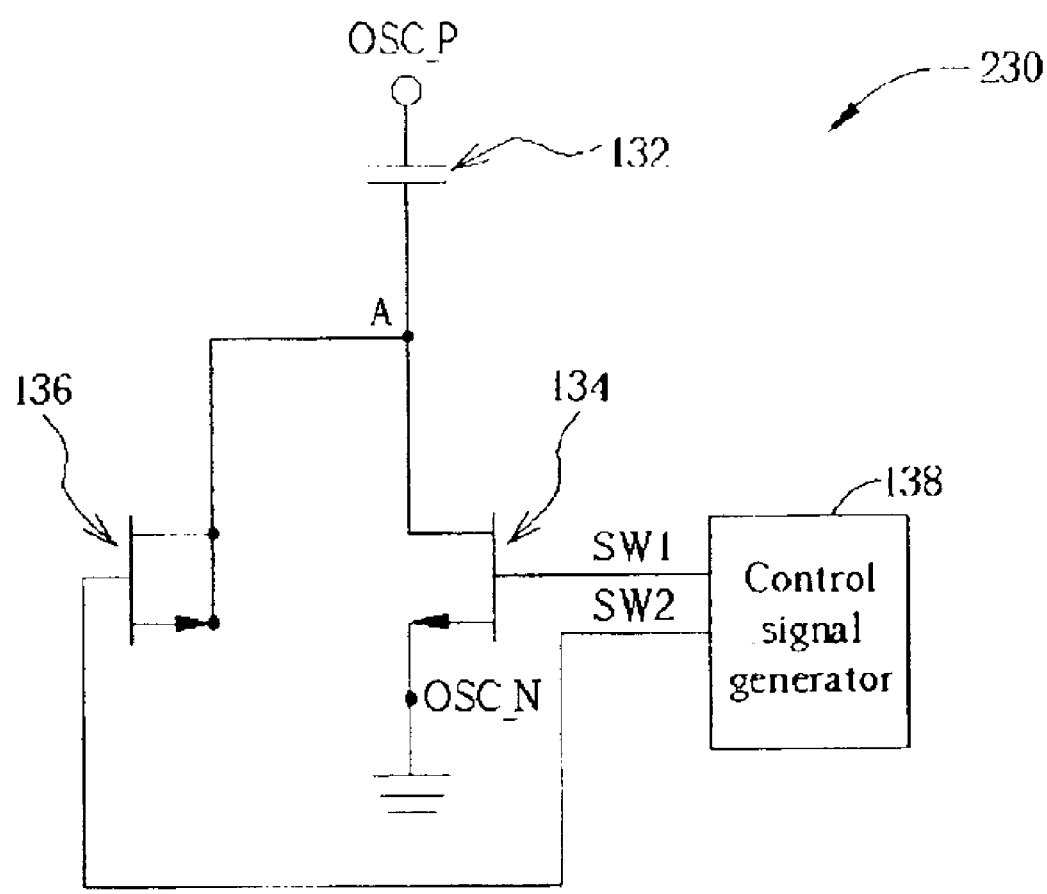
FIG. 11 shows the second embodiment of the present invention for a single ended switched capacitor circuit.

FIG. 11 shows a single ended switched capacitor circuit 230 according to a second embodiment of the present invention. In the second embodiment, the single ended switched capacitor circuit 230 includes the same components and connections as the single ended switched capacitor circuit 130 shown in FIG. 6; however, the dummy switch element 136 has its first and second terminals both shorted to node A. The operational description and clock feedthrough cancellation are otherwise the same as that described for the first embodiment shown in FIG. 6.

Figure 25:
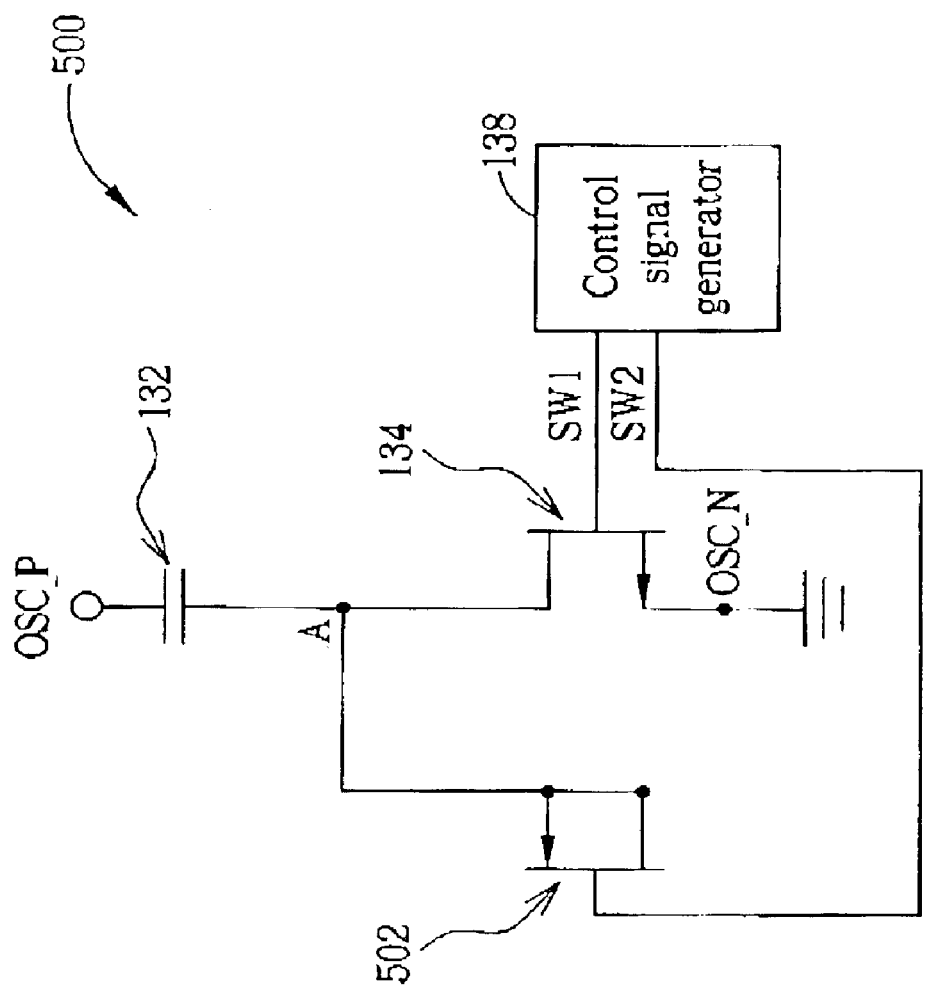
FIG. 25 shows another embodiment of the present invention for a single ended switched capacitor circuit.

FIG. 25 is a single ended switched capacitor circuit 500 according to another embodiment of the present invention. As shown in FIG. 25, the singled ended switched capacitor circuit 500 includes the capacitor 132, the primary switch element 134 having an NMOS transistor, a dununy switch element 502 having a PMOS transistor, and the control signal generator 138. In this embodiment, the first and second terminals of the dummy switch element 502 are both shorted to node A.

Figure 12:
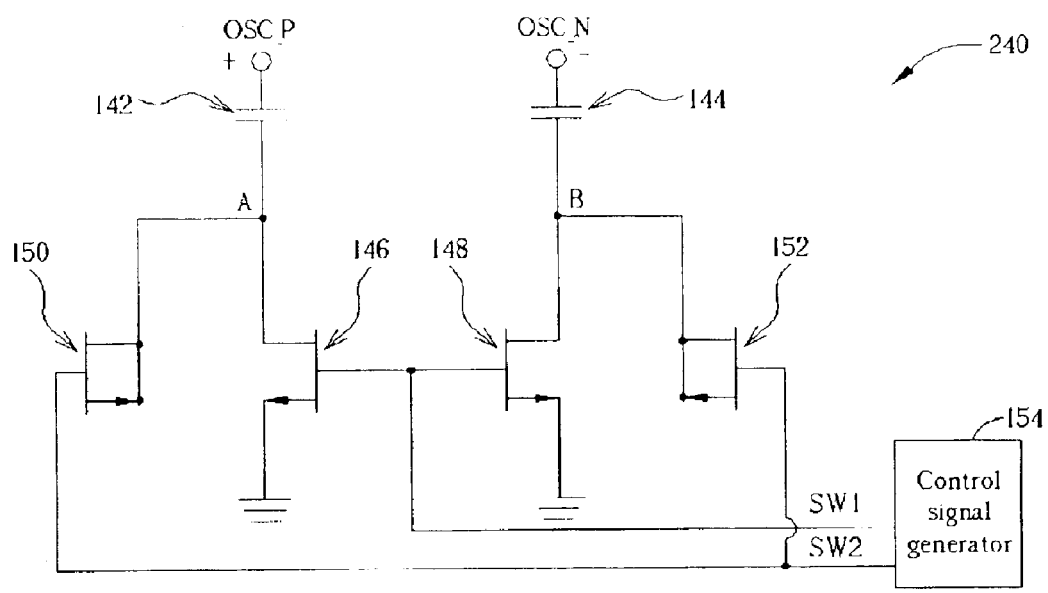
FIG. 12 shows the second embodiment of the present invention for a differential without center switch switched capacitor circuit.

FIG. 12 shows a differential without center switch switched capacitor circuit 240 according to the second embodiment of the present invention. In the second embodiment, the differential without center switch switched capacitor circuit 240 includes the same components and connections as the differential without center switch switched capacitor circuit 140 shown in FIG. 8; however, in the second embodiment the positive side dummy switch element 136 has its first and second terminals both shorted to node A. Similarly, the negative side dummy switch element 152 has its first and second terminals both shorted to node B. The operational description and clock feedthrough cancellation are otherwise the same as that described for the first embodiment shown in FIG. 8.

Figure 13:
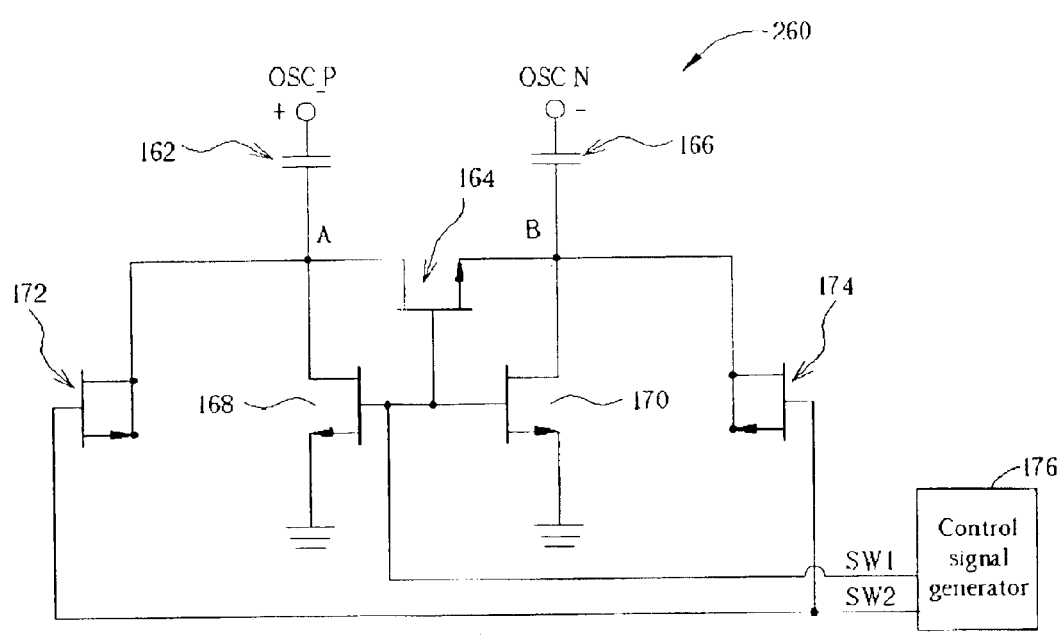
FIG. 13 shows the second embodiment of the present invention for a differential with center switch switched capacitor circuit.

FIG. 13 shows a differential with center switch switched capacitor circuit 260 according to the second embodiment of the present invention. In the second embodiment, the differential with center switch switched capacitor circuit 260 includes the same components and connections as the differential with center switch switched capacitor circuit 160 shown in FIG. 9; however, in the second embodiment the positive side dummy switch element 172 has its first and second terminals both shorted to node A. Similarly, the negative side dummy switch element 274 has its first and second terminals both shorted to node B. The operational description and clock feedthrough cancellation are otherwise the same as that described for the first embodiment shown in FIG. 9.

Figure 14:
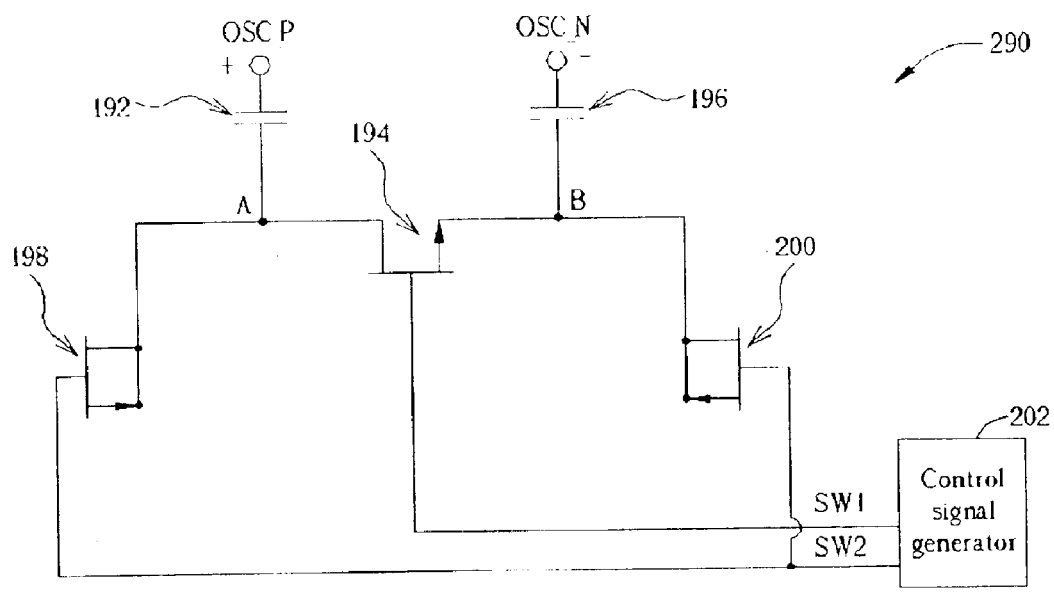
FIG. 14 shows the second embodiment of the present invention for a differential only center switch switched capacitor circuit.

FIG. 14 shows a differential only center switch switched capacitor circuit 290 according to the second embodiment of the present invention. In the second embodiment, the differential only center switch switched capacitor circuit 290 includes the same components and connections as the differential only center switch switched capacitor circuit 190 shown in FIG. 10; however, in the second embodiment the positive side dummy switch element 198 has its first and second terminals both shorted to node A. Similarly, the negative side dummy switch element 300 has its first and second terminals both shorted to node B. The operational description and clock feedthrough cancellation are otherwise the same as that described for the first embodiment shown in FIG. 10.

Figure 15:
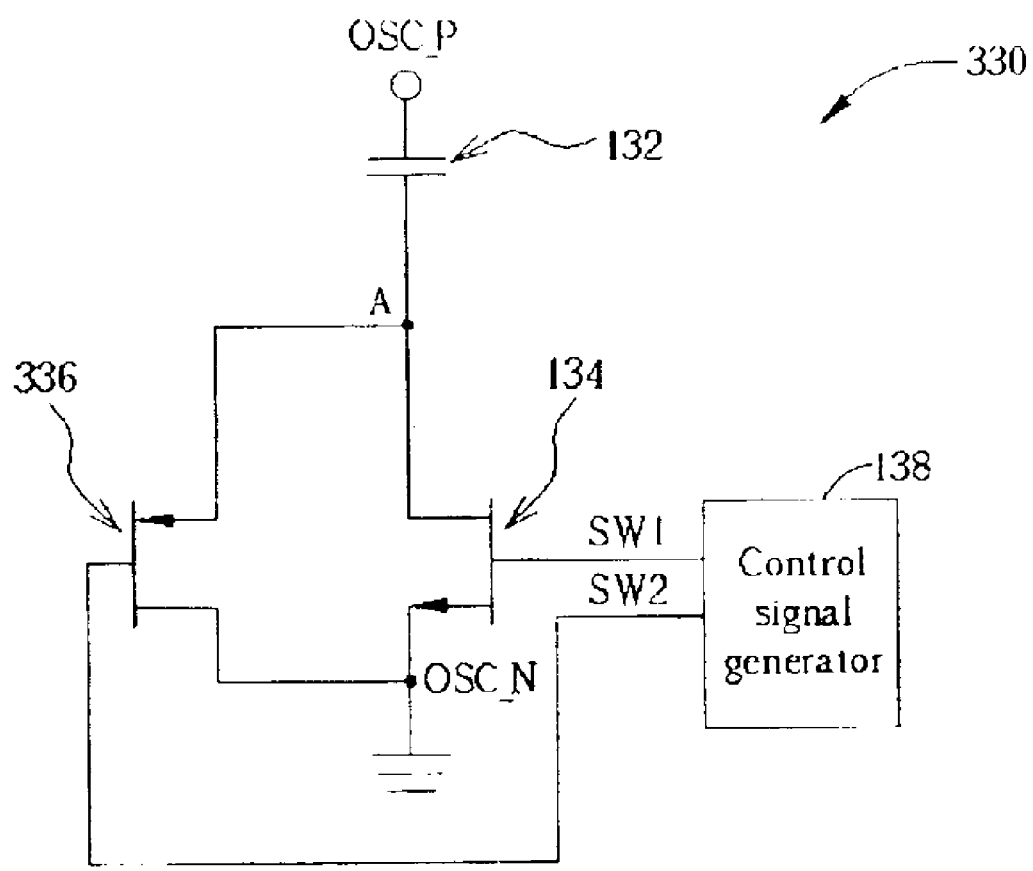
FIG. 15 shows the third embodiment of the present invention for a single ended switched capacitor circuit.

FIG. 15 shows a single ended switched capacitor circuit 330 according to a third embodiment of the present invention. In the third embodiment, the singled ended switched capacitor circuit 330 includes the same components and connections as the single ended switched capacitor circuit 130 shown in FIG. 6; however, the dummy switch 136 shown in FIG. 6 is replaced in FIG. 15 with a complementary switch 336 comprising a PMOS transistor having a control terminal connected to the second control signal SW2, a first terminal connected to node A, and a second terminal connected to ground. The operational description and clock feedthrough cancellation is otherwise the same as that described for the first embodiment shown in FIG. 6.

Figure 16:
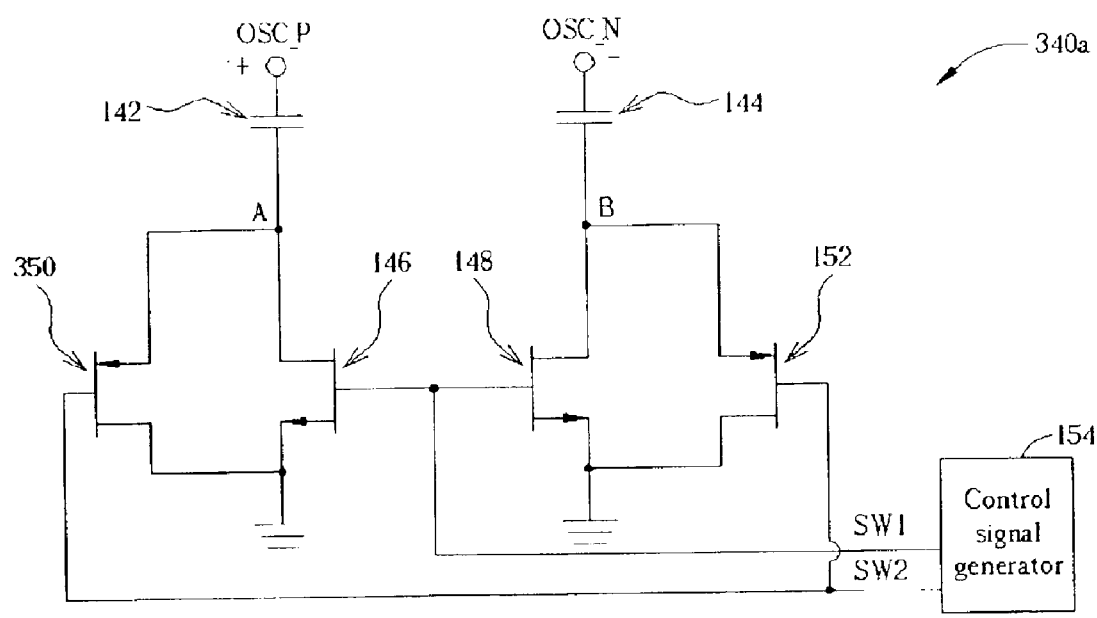
FIG. 16 shows the first version of the third embodiment of the present invention for a differential without center switch switched capacitor circuit.

FIG. 16 shows a first version of a differential without center switch switched capacitor circuit 340a according to the third embodiment of the present invention. In the first version of the third embodiment, the differential without center switch switched capacitor circuit 340a includes the same components and connections as the differential without center switch switched capacitor circuit 140 shown in FIG. 8; however, in the second embodiment the positive side dummy switch 150 shown in FIG. 8 is replaced in FIG. 16 with a complementary switch 350 including a PMOS transistor having a control terminal connected to the second control signal SW2, a first terminal connected to node A, and a second terminal connected to ground. Similarly, the negative side dummy switch element 152 is replaced in FIG. 16 with a dummy switch 352 including a PMOS transistor having a control terminal connected to the second control signal SW2, a first terminal connected to node B, and a second terminal connected to ground. The operational description and clock feedthrough cancellation are otherwise the same as that described for the first embodiment shown in FIG. 8.

Figure 17:
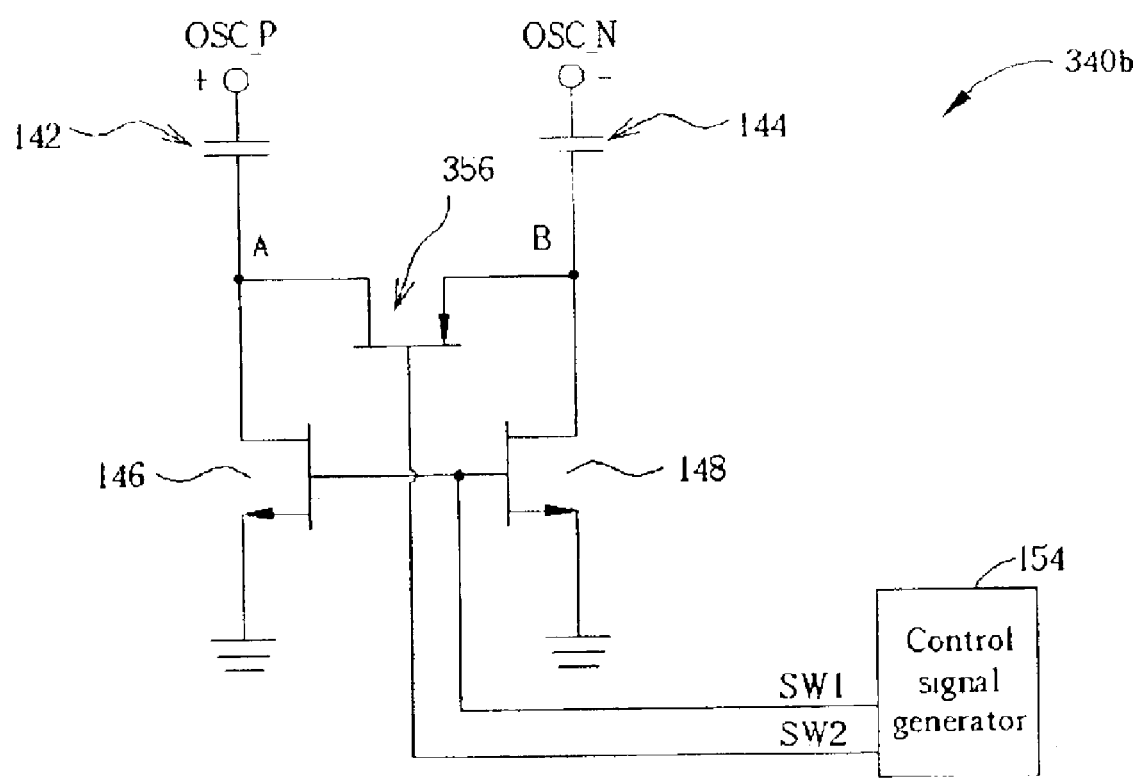
FIG. 17 shows the second version of the third embodiment of the invention for a differential without center switch switched capacitor circuit.

FIG. 17 shows a second version of a differential without center switch switched capacitor circuit 340b according to the third embodiment of the present invention. In the second version of the third embodiment, the differential without center switch switched capacitor circuit 340b includes a positive side capacitor 142, a negative side capacitor 144, a positive side primary switch element 146 having an NMOS transistor, a negative side primary switch element 148 having an NMOS transistor, a center switch element 356 having a PMOS transistor, and a control signal generator 154.

The positive side capacitor 142 is connected between the first oscillator node OSC_P and a node A, and the negative side capacitor 144 is connected between the second oscillator node OSC_N and a node B. The control signal generator 154 provides a first control signal SW1, and a second control signal SW2 that is complementary to the first control signal SW1. The signal diagram for the first control signal SW1 and the second control signal SW2 is the same as that shown in FIG. 7. The positive side primary switch element 146 selectively connects node A to ground based on the first control signal SW1, and the negative side primary switch element 148 selectively connects node B to ground based on the first control signal SW1. The center switch element 356, selectively connects node A to node B based on the second control signal SW2.

The clock feedthrough at node A has two sources: the clock feedthrough from the positive side primary switch element 146 and the clock feedthrough from the center switch element 356. Because the positive side primary switch element 146 is controlled by the first control signal SW1, the clock feedthrough produced at node A due to the switch element 146 will be opposite in polarity to the clock feedthrough produced at node A due to the center switch element 356, which is controlled by the second control signal SW2. By properly sizing the positive side primary switch element 146 such that the voltage step caused by the switch element 146 is of equal magnitude (but opposite polarity) as the clock feedthrough caused by the center switch element 356, the unwanted voltage step at node A is eliminated.

Similarly, the clock feedthrough at node B has two sources: the clock feedthrough from the negative side primary switch element 148 and the clock feedthrough from the center switch element 356. Because the negative side primary switch element 148 is controlled by the first control signal SW1, the clock feedthrough produced at node B due to the switch element 148 will be opposite in polarity to the clock feedthrough produced at node B due to the center switch element 356, which is controlled by the second control signal SW2. By properly sizing the negative side primary switch element 148 such that the voltage step caused by the switch element 148 is of equal magnitude (but opposite polarity) as the clock feedthrough caused by the center switch element 356, the unwanted voltage step at node B is eliminated. Because the clock feedthrough at node A and node B is eliminated, so is the unwanted momentary capacitance change and associated frequency shift and drift in the VCO 10.

Figure 18:
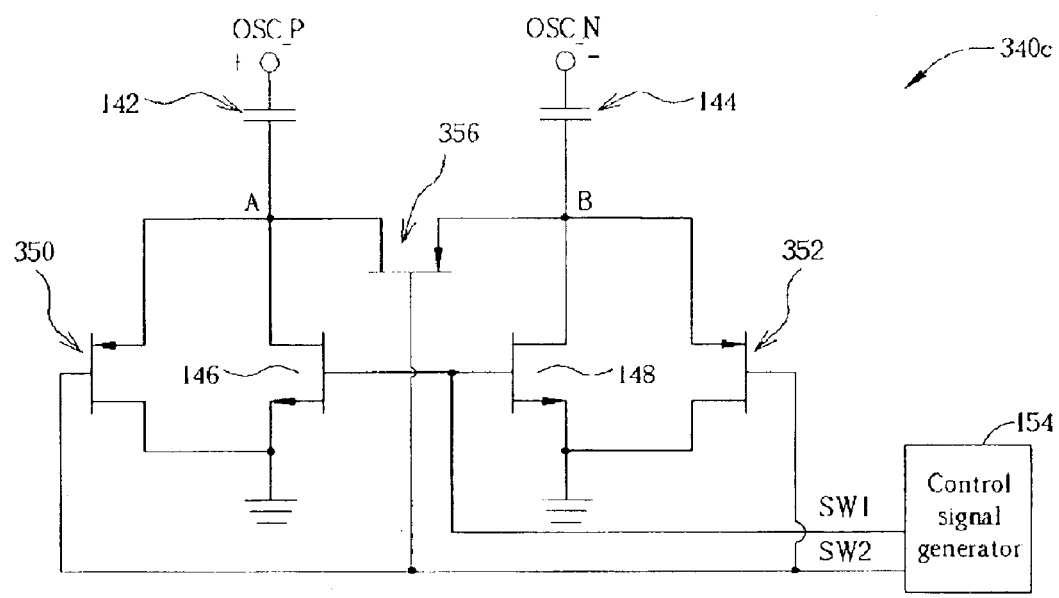
FIG. 18 shows the third version of the third embodiment of the present invention for a differential without center switch switched capacitor circuit.

FIG. 18 shows a third version of a differential without center switch switched capacitor circuit 340c according to the third embodiment of present invention. In the third version of the third embodiment, the differential without center switch switched capacitor circuit 340c includes a positive side capacitor 142, a negative side capacitor 144, a center switch element 356 having a PMOS transistor, a positive side primary switch element 146 having an NMOS transistor, a negative side primary switch element 148 having an NMOS transistor, a positive side complementary switch element 350 having a PMOS transistor, a negative side complementary switch element 352 having a PMOS transistor, and a control signal generator 154.

The positive side capacitor 142 is connected between the first oscillator node OSC_P and a node A, and the negative side capacitor 144 is connected between the second oscillator node OSC_N and a node B. The control signal generator 154 provides a first control signal SW1, and a second control signal SW2 that is complementary to the first control signal SW1. The signal diagram for the first control signal SW1 and the second control signal SW2 is the same as that shown in FIG. 7. The center switch element 356 selectively connects node A to node B depending on the second control signal SW2. The positive side primary switch element 146 selectively connects node A to ground based on the first control signal SW1, and the negative side primary switch element 148 selectively connects node B to ground based on the first control signal SW1. The positive side complementary switch element 350 selectively connects node A to ground based on the second control signal SW2 and the negative side complementary switch element 352 selectively connects node B to ground based on the second control signal SW2.

The clock feedthrough at node A has three sources: the clock feedthrough from the center switch element 356, the clock feedthrough from the positive side primary switch element 146, and the clock feedthrough from the positive side complementary switch element 350. Because the center switch element 356 and the positive side complementary switch element 350 are controlled by the second control signal SW2, the clock feedthrough produced at node A due to these two switch elements 356, 150 will be opposite in polarity to the clock feedthrough produced at node A due to the positive side primary switch element 146, which is controlled by the first control signal SW1. By properly sizing the positive side primary switch element 346c such that the voltage step caused by the switch element 146 is of equal magnitude (but opposite polarity) as the combined clock feedthrough caused by the switch elements 350 and 356, the unwanted voltage step at node A is eliminated.

Similarly, the clock feedthrough at node B has three sources: the clock feedthrough from the center switch element 356, the clock feedthrough from the negative side primary switch element 148, and the clock feedthrough from the negative side complementary switch element 352. Because the center switch element 356 and the negative side complementary switch element 352 are controlled by the second control signal SW2, the clock feedthrough produced at node B due to these two switch elements 352, 356 will be opposite in polarity to the clock feedthrough produced at node B due to the negative side primary switch element 148, which is controlled by the first control signal SW1. By properly sizing the negative side primary switch element 148 such that the voltage step caused by the switch element 148 is of equal magnitude (but opposite polarity) as the combined clock feedthrough caused by the switch elements 356 and 352, the unwanted voltage step at node B is eliminated. Because the clock feedthrough at node A and node B is eliminated, so is the unwanted momentary capacitance change and associated frequency shift and drift in the VCO 10.

Figure 19:
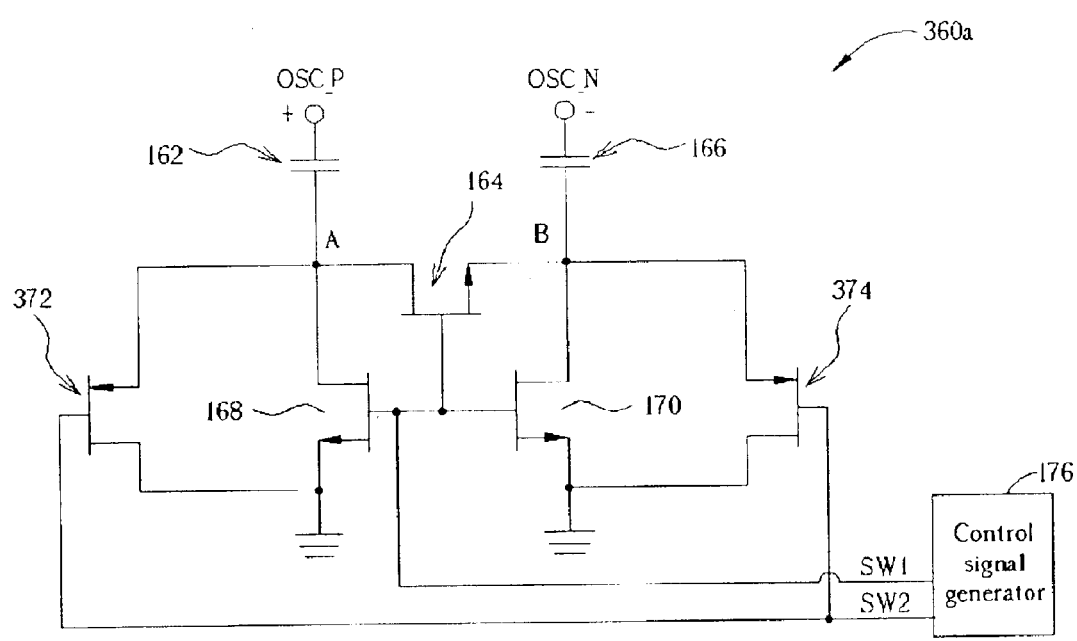
FIG. 19 shows the first version of the third embodiment of the present invention for a differential with center switch switched capacitor circuit.

FIG. 19 shows a first version of a differential with center switch switched capacitor circuit 360a according to the third embodiment of the present invention. In the first version of the third embodiment, the differential with center switch switched capacitor circuit 360a includes the same components and connections as the differential with center switch switched capacitor circuit 160 shown in FIG. 9; however, in the second embodiment the positive side dummy switch element 172 shown in FIG. 9 is replaced in FIG. 19 with a positive side complementary switch 372 having a PMOS transistor that selectively connects node A to ground based on the complement of the second control signal SW2. Similarly, the negative side dummy switch element 174 shown in FIG. 9 is replaced in FIG. 19 with a negative side complementary switch 374 comprising a PMOS transistor that selectively connects node B to ground based on the complement of the second control signal SW2. The operational description and clock feedthrough cancellation are otherwise exactly the same as that described for the first embodiment shown in FIG. 9.

Figure 20:
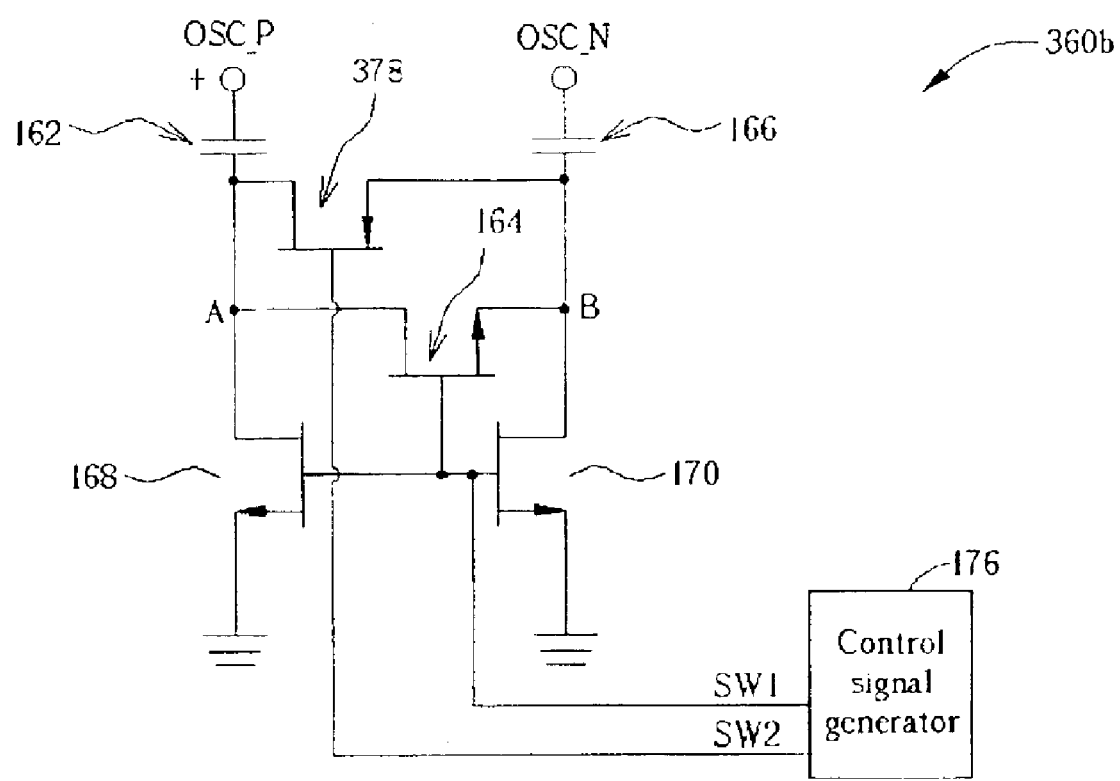
FIG. 20 shows the second version of the third embodiment of the invention for a differential with center switch switched capacitor circuit.

FIG. 20 shows a second version of the differential with center switch switched capacitor circuit 360b according to the third embodiment of the present invention. In the second version of the third embodiment, the differential with center switch switched capacitor circuit 360b includes a positive side capacitor 162, a negative side capacitor 166, a center switch element 164 having an NMOS transistor, a positive side primary switch element 168 having an NMOS transistor, a negative side primary switch element 170 having an NMOS transistor, a complementary center switch element 378 having a PMOS transistor, and a control signal generator 176.

The positive side capacitor 162 is connected between the first oscillator node OSC_P and a node A, and the negative side capacitor 166 is connected between the second oscillator node OSC_N and a node B. The control signal generator 176 provides a first control signal SW1, and a second control signal SW2 that is complementary to the first control signal SW1. The signal diagram for the first control signal SW1 and the second control signal SW2 is the same as that shown in FIG. 7. The center switch element 164 selectively connects node A to node B depending on the first control signal SW1. The complementary center switch element 378 selectively connects node A to node B depending on the complement of second control signal SW2. The positive side primary switch element 168 selectively connects node A to ground based on the first control signal SW1, and the negative side primary switch element 170 selectively connects node B to ground based on the first control signal SW1.

The clock feedthrough at node A has three sources: the clock feedthrough from the center switch element 164, the clock feedthrough from the positive side primary switch element 168, and the clock feedthrough from the complementary center switch element 378. Because the center switch element 164 and the positive side primary switch element 168 are controlled by the first control signal SW1, the clock feedthrough produced at node A due to these two switch elements 164, 168 will be opposite in polarity to the clock feedthrough produced at node A due to the complementary center switch element 378, which is controlled by the second control signal SW2. By properly sizing the complementary center switch element 378 such that the voltage step caused by the switch element 378 is of equal magnitude (but opposite polarity) as the combined clock feedthrough caused by the switch elements 164 and 168, the unwanted voltage step at node A is eliminated.

Similarly, the clock feedthrough at node B has three sources: the clock feedthrough from the center switch element 164, the clock feedthrough from the negative side primary switch element 170, and the clock feedthrough from the complementary center switch element 378. Because the center switch element 164 and the negative side primary switch element 170 are controlled by the first control signal SW1, the clock feedthrough produced at node B due to these two switch elements 164, 170 will be opposite in polarity to the clock feedthrough produced at node B due to the complementary center switch element 378, which is controlled by the second control signal SW2. By properly sizing the complementary center switch element 378 such that the voltage step caused by the switch element 378 is of equal magnitude (but opposite polarity) as the combined clock feedthrough caused by the switch elements 164 and 170, the unwanted voltage step at node B is eliminated. Because the clock feedthrough at node A and node B is eliminated, so is the unwanted momentary capacitance change and associated frequency shift and drift in the VCO 10.

Figure 21:
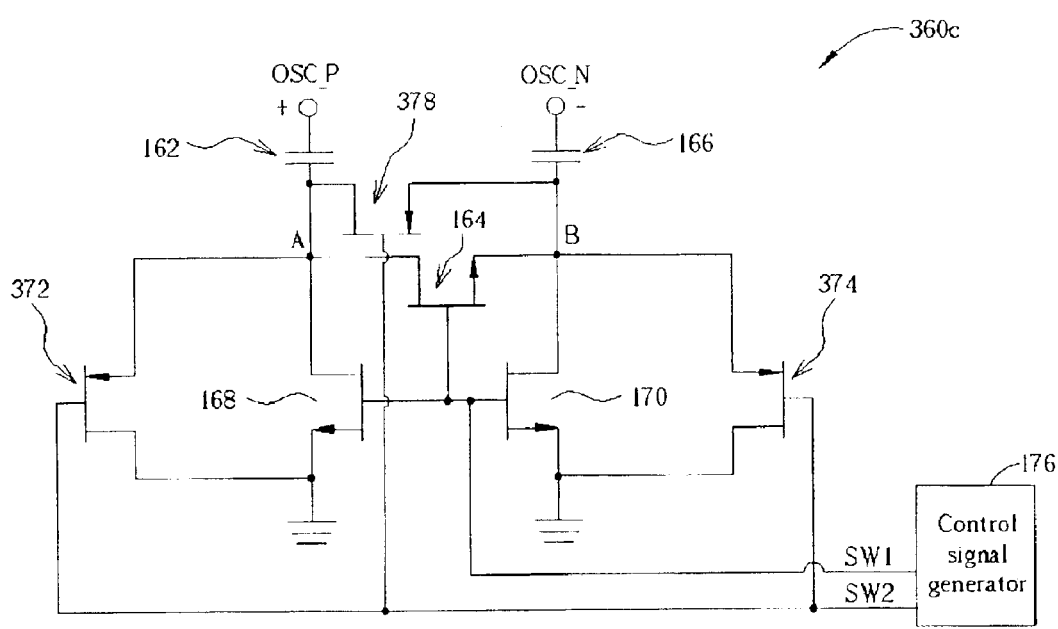
FIG. 21 shows the third version of the third embodiment of the present invention for a differential with center switch switched capacitor circuit.

FIG. 21 shows a third version of the differential with center switch switched capacitor circuit 360c according to the third embodiment of the present invention. In the third version of the third embodiment, the differential with center switch switched capacitor circuit 360c includes a positive side capacitor 162, a negative side capacitor 166, a center switch element 164 having an NMOS transistor, a positive side primary switch element 168 having an NMOS transistor, a negative side primary switch element 170 having an NMOS transistor, a positive side complementary switch element 172 having a PMOS transistor, a negative side complementary switch element 174 having a PMOS transistor, a complementary center switch element 378 having a PMOS transistor, and a control signal generator 176.

The positive side capacitor 162 is connected between the first oscillator node OSC_P and a node A, and the negative side capacitor 166 is connected between the second oscillator node OSC_N and a node B. The control signal generator 176 provides a first control signal SW1, and a second control signal SW2 that is complementary to the first control signal SW1. The signal diagram for the first control signal SW1 and the second control signal SW2 is the same as that shown in FIG. 7. The center switch element 164 selectively connects node A to node B depending on the first control signal SW1. The positive side primary switch element 168 selectively connects node A to ground based on the first control signal SW1, and the negative side primary switch element 170 selectively connects node B to ground based on the first control signal SW1. The positive side complementary switch element 372 selectively connects node A to ground based on the complement of the second control signal SW2. The negative side complementary switch element 374 selectively connects node B to ground based on the complement of the second control signal SW2.

The clock feedthrough at node A has four sources: the clock feedthrough from the center switch element 164, the clock feedthrough from the complementary center switch element 378, the clock feedthrough from the positive side primary switch element 168, and the clock feedthrough from the positive side complementary switch element 372. Because the center switch element 164 and the positive side primary switch element 168 are controlled by the first control signal SW1, the clock feedthrough produced at node A due to these two switch elements 164, 168 will be opposite in polarity to the clock feedthrough produced at node A due to the positive side complementary switch element 372 and the complementary center switch element 378, which are controlled by the second control signal SW2. By properly sizing the positive side complementary switch element 372 and the complementary center switch element 378 such that the voltage step caused by the switch elements 372 and 378 are of equal magnitude (but opposite polarity) as the combined clock feedthrough caused by the switch elements 164 and 168, the unwanted voltage step at node A is eliminated.

Similarly, the clock feedthrough at node B has four sources: the clock feedthrough from the center switch element 164, the clock feedthrough from the complementary center switch element 378, the clock feedthrough from the negative side primary switch element 170, and the clock feedthrough from the negative side complementary switch element 374. Because the center switch element 164 and the negative side primary switch element 170 are controlled by the first control signal SW1, the clock feedthrough produced at node B due to these two switch elements 164, 170 will be opposite in polarity to the clock feedthrough produced at node B due to the negative side complementary switch element 374 and the complementary center switch element 378, which are controlled by the second control signal SW2. By properly sizing the negative side complementary switch element 374 and the complementary center switch element 378 such that the voltage step caused by the switch elements 374 and 378 are of equal magnitude (but opposite polarity) as the combined clock feedthrough caused by the switch elements 164 and 170, the unwanted voltage step at node B is eliminated. Because the clock feedthrough at node A and node B is eliminated, so is the unwanted momentary capacitance change and associated frequency shift and drift in the VCO 10.

Figure 22:
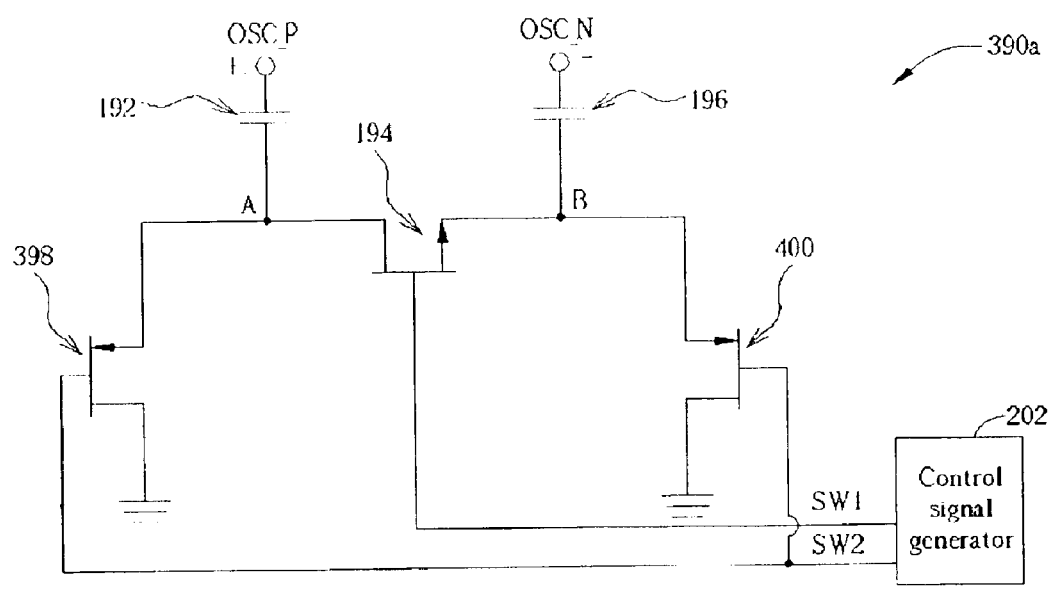
FIG. 22 shows the first version of the third embodiment of the present invention for a differential only center switch switched capacitor circuit.

FIG. 22 shows a first version of a differential only center switch switched capacitor circuit 390a according to the third embodiment of the present invention. In the first version of the third embodiment, the differential only center switch switched capacitor circuit 390a comprises the same components and connections as the differential only center switch switched capacitor circuit 190 shown in FIG. 10; however, in the positive side dummy switch element 198 shown in FIG. 10 has been replaced in FIG. 22 with a positive side complementary switch element 398 including a PMOS transistor that selectively connects node A to ground based on the second control signal SW2. Similarly, the negative side dummy switch element 200 shown in FIG. 10 has been replaced in FIG. 22 with a negative side complementary switch element 400 that selectively connects node B to ground based on the second control signal SW2. The operational description and clock feedthrough cancellation are otherwise the same as that described for the first embodiment shown in FIG. 10.

Figure 23:
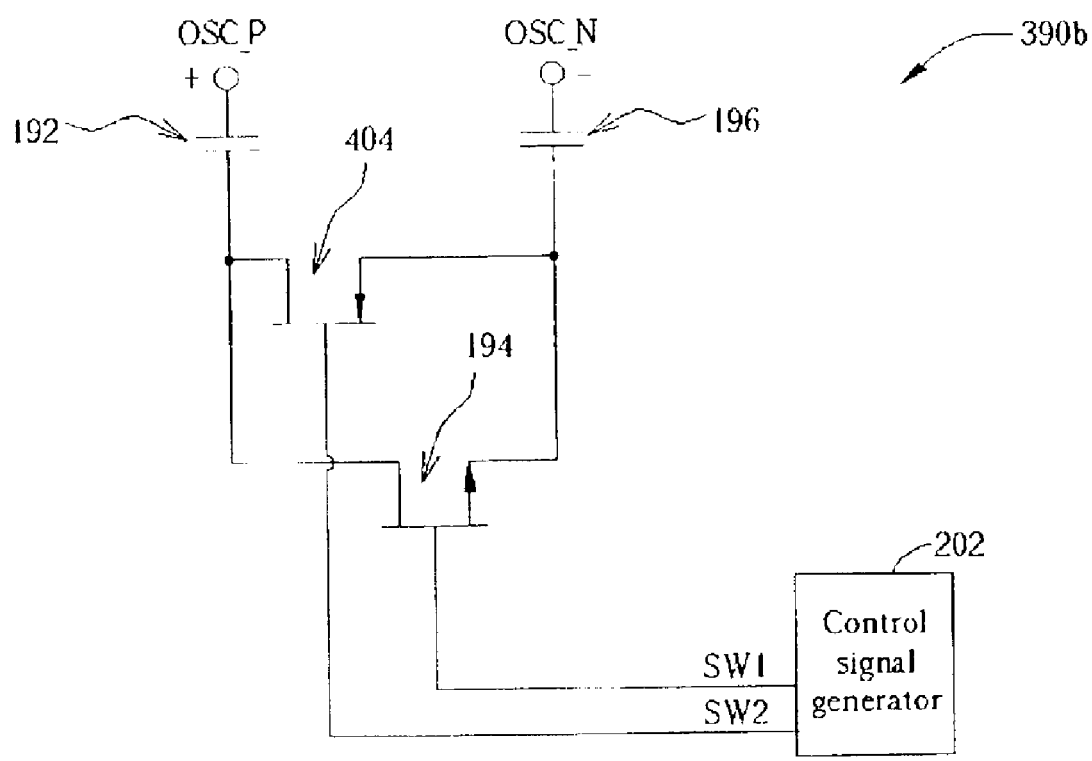
FIG. 23 shows the second version of the third embodiment of the invention for a differential only center switch switched capacitor circuit.

FIG. 23 shows a second version of the differential only center switch switched capacitor circuit 390b according to the third embodiment of the present invention. In the second version of the third embodiment, the differential only center switch switched capacitor circuit 390b includes a positive side capacitor 192, a negative side capacitor 196, a center switch element 194 having of an NMOS transistor, a complementary center switch element 404 having of a PMOS transistor, and a control signal generator 202.

The positive side capacitor 192 is connected between the first oscillator node OSC_P and a node A, and the negative side capacitor 196 is connected between the second oscillator node OSC_N and a node B. The control signal generator 202 provides a first control signal SW1 a second control signal SW2 that is complementary to the first control signal SW1. The signal diagram for the first control signal SW1 and the second control signal SW2 is the same as that shown in FIG. 7. The center switch element 194 selectively connects node A to node B based on the first control signal SW1. The complementary center switch element 404 selectively connects node A to node B based on the complement of the second control signal SW2.

The clock feedthrough at node A has two sources: the clock feedthrough from the center switch element 194 and the clock feedthrough from the complementary center switch element 404. Because the center switch element 194 is controlled by the first control signal SW1, the clock feedthrough produced at node A due to the switch element 194 will be opposite in polarity to the clock feedthrough produced at node A due to the complementary center switch element 404, which is controlled by the second control signal SW2. By properly sizing the complementary switch element 404 such that the voltage step caused by the switch element 404 is of equal magnitude (but opposite polarity) as the clock feedthrough caused by the center switch element 194, the unwanted voltage step at node A is eliminated.

Because the clock feedthrough at node B has the same sources, eliminating the clock feedthrough at node A will automatically eliminate the clock feedthrough at node B. Because the clock feedthrough at node A and node B is eliminated, so is the unwanted momentary capacitance change and associated frequency shift and drift in the VCO 10.

Figure 24:
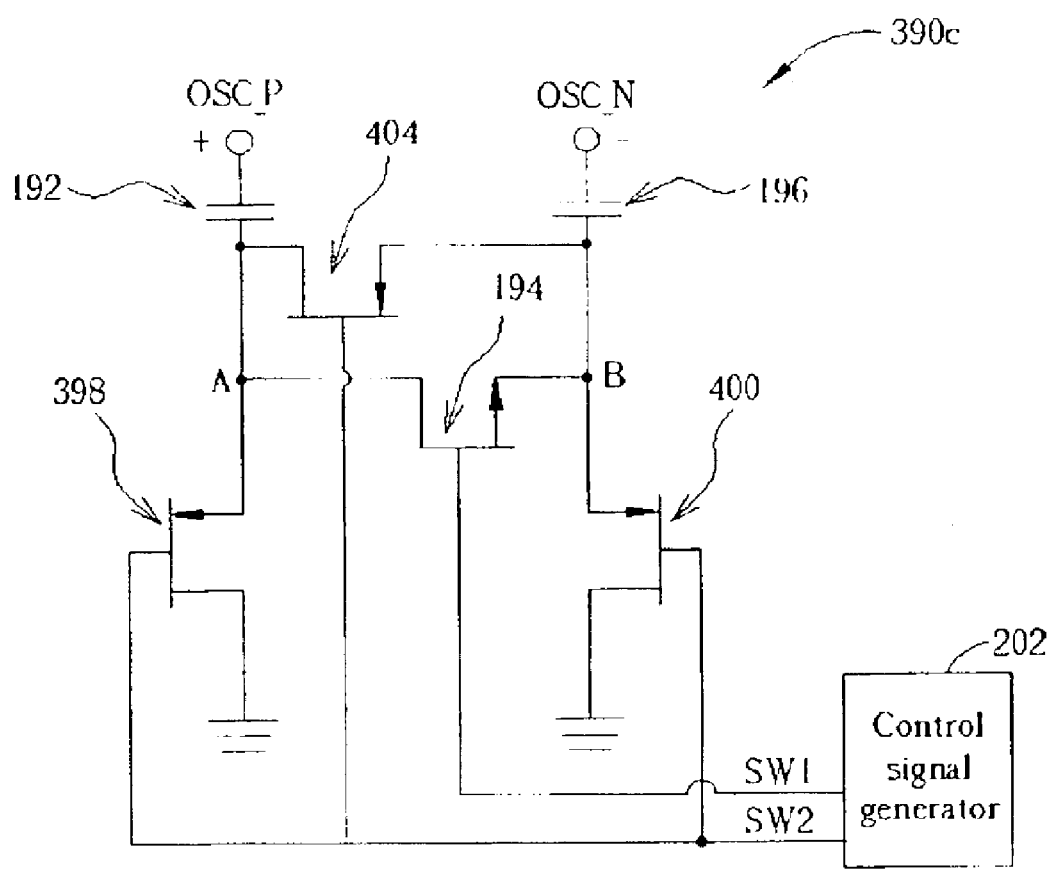
FIG. 24 shows the third version of the third embodiment of the present invention for a differential only center switch switched capacitor circuit.

FIG. 24 shows a third version of the differential only center switch switched capacitor circuit 390c according to the third embodiment of present invention. In the third version of the third embodiment, the differential only center switch switched capacitor circuit 390c includes a positive side capacitor 192, a negative side capacitor 196, a center switch element 194 having an NMOS transistor, a positive side complementary switch element 398 having a PMOS transistor, a negative side complementary switch element 400 having a PMOS transistor, a complementary center switch element 404 having a PMOS transistor, and a control signal generator 202.

The positive side capacitor 192 is connected between the first oscillator node OSC_P and a node A and the negative side capacitor 196 is connected between the second oscillator node OSC_N and a node B. The control signal generator 202 provides a first control signal SW1, and a second control signal SW2 that is complementary to the first control signal SW1. The signal diagram for the first control signal SW1 and the second control signal SW2 is the same as that shown in FIG. 7. The center switch element 194 selectively connects node A to node B depending on the first control signal SW1. The complementary center switch element 404 selectively connects node A to node B depending on the complement of second control signal SW2. The positive side complementary switch element 398 selectively connects node A to ground based on the second control signal SW2, and the negative side complementary switch element 400 selectively connects node B to ground based on the second control signal SW2.

The clock feedthrough at node A has three sources: the clock feedthrough from the center switch element 194, the clock feedthrough from the positive side complementary switch element 398, and the clock feedthrough from the complementary center switch element 404. Because the complementary center switch element 404 and the positive side complementary switch element 398 are controlled by the second control signal SW2, the clock feedthrough produced at node A due to these two switch elements 404, 398 will be opposite in polarity to the clock feedthrough produced at node A due to the center switch element 194, which is controlled by the first control signal SW1. By properly sizing the center switch element 194 such that the voltage step caused by the switch element 194 is of equal magnitude (but opposite polarity) as the combined clock feedthrough caused by the switch elements 398 and 404, the unwanted voltage step at node A is eliminated.

Similarly, the clock feedthrough at node B has three sources: the clock feedthrough from the center switch element 194, the clock feedthrough from the negative side complementary switch element 400, and the clock feedthrough from the complementary center switch element 404. Because the complementary center switch element 404 and the negative side complementary switch element 400 are controlled by the second control signal SW2, the clock feedthrough produced at node B due to these two switch elements 404, 400 will be opposite in polarity with the clock feedthrough produced at node B due to the center switch element 194, which is controlled by the first control signal SW1. By properly sizing the center switch element 194 such that the voltage step caused by the switch element 194 is of equal magnitude (but opposite polarity) as the combined clock feedthrough caused by the switch elements 404 and 400, the unwanted voltage step at node B is eliminated. Because the clock feedthrough at node A and node B is eliminated, so is the unwanted momentary capacitance change and associated frequency shift and drift in the VCO 10.

In contrast to the prior art, the present invention uses either a complementary controlled dummy switch element or a complementary controlled complementary switch element to eliminate the clock feedthrough when switching off the switched capacitor circuit so that there is a much smaller unwanted momentary capacitance change and associated frequency shift and drift of the VCO. When switching off, the prior art implementations suffer from clock feedthrough that causes a voltage step to occur at a capacitance node of the VCO 10. The voltage step change causes the floating parasitic junction diode formed by a switch element in the off state to be slightly forward biased until the dropped voltage returns to the ground potential. According to the present invention, the voltage step at the internal capacitance node is eliminated by the additional switches that have complementary control signals. When switching off, the present invention does not have a momentary change in the capacitance value or a momentary shift and drift in the VCO 10 frequency.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A switched capacitor circuit capable of eliminating clock feedthrough for use in an oscillator having an output frequency, the switched capacitor circuit comprising:

a control signal generator for generating a first control signal and a second control signal, wherein the second control signal is complementary to the first control signal;

a positive side primary switch element selectively connecting a positive side first node to a positive side second node depending upon the first control signal, wherein the positive side first node is connected to a positive side capacitance; and a positive side additional switch element selectively connecting the positive side first node to a positive side third node depending upon the second control signal;

wherein during a time that the positive side primary switch element is connecting the positive side first node to the positive side second node such that the switched capacitor circuit is connected to a resonator of the oscillator, the output frequency of the oscillator is a first frequency value, and during a time that the positive side primary switch element is not connecting the positive side first node to the positive side second node such that the switched capacitor circuit is not connected to the resonator of the oscillator, the output frequency of the oscillator is a second frequency value being different than the first frequency value.

2. The switched capacitor circuit of claim 1 wherein:

the positive side primary switch element comprises an NMOS transistor;

the positive side additional switch element comprises an NMOS transistor;

the positive side second node is connected to ground; and the positive side third node is not connected.

3. The switched capacitor circuit of claim 1 wherein:

the positive side primary switch element comprises an NMOS transistor;

the positive side additional switch element comprises a PMOS transistor;

the positive side second node is connected to ground; and the positive side third node is connected to ground.

4. The switched capacitor circuit of claim 1 wherein:

the positive side primary switch element comprises an NMOS transistor;

the positive side additional switch element comprises an NMOS transistor;

the positive side second node is connected to ground; and the positive side third node is connected to the positive side first node.

5. The switched capacitor circuit of claim 1 wherein:

the positive side primary switch element comprises an NMOS transistor;

the positive side additional switch element comprises a PMOS transistor;

the positive side second node is connected to ground; and the positive side third node is connected to the positive side first node.

6. The switched capacitor circuit of claim 1 further comprising:

a negative side primary switch element selectively connecting the negative side first node to a negative side second node depending upon the first control signal, wherein the negative side first node is connected to a negative side capacitance; and a negative side additional switch element selectively connecting the negative side first node to a negative side third node depending upon the second control signal.

7. The switched capacitor circuit of claim 6 wherein:

the positive side primary switch element comprises an NMOS transistor;

the negative side primary switch element comprises an NMOS transistor;

the positive side additional switch element comprises an NMOS transistor;

the negative side additional switch element comprises an NMOS transistor;

the positive side second node is connected to ground;

the negative side second node is connected to ground;

the positive side third node is not connected; and the negative side third node is not connected.

8. The switched capacitor circuit of claim 6 wherein:

the positive side primary switch element comprises an NMOS transistor;

the negative side primary switch element comprises an NMOS transistor;

the positive side additional switch element comprises a PMOS transistor;

the negative side additional switch element comprises a PMOS transistor;

the positive side second node is connected to ground;

the negative side second node is connected to ground;

the positive side third node is connected to ground; and the negative side third node is connected to ground.

9. The switched capacitor circuit of claim 6 wherein:

the positive side primary switch element comprises an NMOS transistor;

the negative side primary switch element comprises an NMOS transistor;

the positive side additional switch element comprises an NMOS transistor;

the negative side additional switch element comprises an NMOS transistor;

the positive side second node is connected to ground;

the negative side second node is connected to ground;

the positive side third node is connected to the positive side first node; and the negative side third node is connected to the negative side first node.

10. The switched capacitor circuit of claim 6 wherein:

the positive side primary switch element comprises an NMOS transistor;

the negative side primary switch element comprises an NMOS transistor;

the positive side additional switch element comprises a PMOS transistor;

the negative side additional switch element comprises a PMOS transistor;

the positive side second node is connected to ground;

the negative side second node is connected to ground;

the positive side third node is connected to the positive side first node; and the negative side third node is connected to the negative side first node.

11. The switched capacitor circuit of claim 6 further comprising a center switch element selectively connecting the positive side first node to the negative side first node depending upon a center control signal.

12. The switched capacitor circuit of claim 11 wherein:

the center switch element comprises an NMOS transistor;

the center control signal is connected to the first control signal;

the positive side primary switch element comprises an NMOS transistor;

the negative side primary switch element comprises an NMOS transistor;

the positive side additional switch element comprises an NMOS transistor;

the negative side additional switch element comprises an NMOS transistor;

the positive side second node is connected to ground;

the negative side second node is connected to ground;

the positive side third node is not connected; and the negative side third node is not connected.

13. The switched capacitor circuit of claim 11 wherein:

the center switch element comprises an NMOS transistor;

the center control signal is connected to the first control signal;

the positive side primary switch element comprises an NMOS transistor;

the negative side primary switch element comprises an NMOS transistor;

the positive side additional switch element comprises an NMOS transistor;

the negative side additional switch element comprises an NMOS transistor;

the positive side second node is connected to ground;

the negative side second node is connected to ground;

the positive side third node is connected to the positive side first node; and the negative side third node is connected to the negative side first node.

14. The switched capacitor circuit of claim 11 wherein:

the center switch element comprises an NMOS transistor;

the center control signal is connected to the first control signal;

the positive side primary switch element comprises an NMOS transistor;

the negative side primary switch element comprises an NMOS transistor;

the positive side additional switch element comprises a PMOS transistor;

the negative side additional switch element comprises a PMOS transistor;

the positive side second node is connected to ground;

the negative side second node is connected to ground;

the positive side third node is connected to the positive side first node; and the negative side third node is connected to the negative side first node.

15. The switched capacitor circuit of claim 11 wherein:

the center switch element comprises an NMOS transistor;

the center control signal is connected to the first control signal;

the positive side primary switch element comprises an NMOS transistor;

the negative side primary switch element comprises an NMOS transistor;

the positive side additional switch element comprises a PMOS transistor;

the negative side additional switch element comprises a PMOS transistor;

the positive side second node is connected to ground;

the negative side second node is connected to ground;

the positive side third node is connected to ground; and the negative side third node is connected to ground.

16. The switched capacitor circuit of claim 11 wherein:

the center switch element comprises a PMOS transistor;

the center control signal is connected to the second control signal;

the positive side primary switch element comprises an NMOS transistor;

the negative side primary switch element comprises an NMOS transistor;

the positive side additional switch element comprises a PMOS transistor;

the negative side additional switch element comprises a PMOS transistor;

the positive side second node is connected to ground;

the negative side second node is connected to ground;
the positive side third node is connected to ground; and
the negative side third node is connected to ground.

17. The switched capacitor circuit of claim 11 further comprising a complementary center switch element selectively connecting the positive side first node to the negative side first node depending upon the second control signal.

18. The switched capacitor circuit of claim 17 wherein:
the center switch element comprises an NMOS transistor;
the center control signal is connected to the first control signal;
the complementary center switch element comprises a PMOS transistor;
the positive side primary switch element comprises an NMOS transistor;
the negative side primary switch element comprises an NMOS transistor;
the positive side additional switch element comprises a PMOS transistor;
the negative side additional switch element comprises a PMOS transistor;
the positive side second node is connected to ground;
the negative side second node is connected to ground;
the positive side third node is connected to ground; and
the negative side third node is connected to ground.

19. A switched capacitor circuit capable of eliminating clock feedthrough for use in an oscillator having at least one output frequency, the output frequency varying as a capacitance within the oscillator varies, the switched capacitor circuit comprising:
a control signal generator for generating a first control signal and a second control signal, wherein the second control signal is complementary to the first control signal;
a center switch element selectively connecting a positive side first node to a negative side first node depending upon the first control signal, wherein the positive side first node is connected to a positive side capacitance and the negative side first node is connected to a negative side capacitance; and
a complementary center switch element selectively connecting the positive side first node to the negative side first node depending upon the second control signal.

20. The switched capacitor circuit of claim 19 wherein:
the center switch element comprises an NMOS transistor; and
the complementary switch element comprises a PMOS transistor.

21. The switched capacitor circuit of claim 19 further comprising:
a positive side additional switch element selectively connecting the positive side first node to a positive side second node depending upon the first control signal; and
a negative side additional switch element selectively connecting the negative side first node to a negative side second node depending upon the first control signal.

22. The switched capacitor circuit of claim 21 wherein:
the center switch element comprises an NMOS transistor;
the complementary center switch element comprises a PMOS transistor;
the positive side additional switch element comprises an NMOS transistor;
the negative side additional switch element comprises an NMOS transistor;
the positive side second node is connected to ground; and
the negative side second node is connected to ground.

23. The switched capacitor circuit of claim 19 further comprising:
a positive side additional switch element selectively connecting the positive side first node to a positive side second node depending upon the second control signal; and
a negative side additional switch element selectively connecting the negative side first node to a negative side second node depending upon the second control signal.

24. The switched capacitor circuit of claim 23 wherein:
the center switch element comprises an NMOS transistor;
the complementary center switch element comprises a PMOS transistor;
the positive side additional switch element comprises a PMOS transistor;
the negative side additional switch element comprises a PMOS transistor;
the positive side second node is connected to ground; and
the negative side second node is connected to ground.

25. A switched capacitor circuit capable of eliminating clock feedthrough for use in an oscillator having at least one output frequency, the output frequency varying as a capacitance within the oscillator varies, the switched capacitor circuit comprising:
a control signal generator for generating a first control signal and a second control signal, wherein the second control signal is complementary to the first control signal;
a center switch element selectively connecting a positive side first node to a negative side first node depending upon the first control signal, wherein the positive side first node is connected to a positive side capacitance and the negative side first node is connected to a negative side capacitance;
a positive side primary switch element selectively connecting the positive side first node to a positive side second node depending upon second control signal; and
a negative side primary switch element selectively connecting the negative side first node to a negative side second node depending upon the second control signal.

26. The switched capacitor circuit of claim 25 wherein:
the center switch element comprises an NMOS transistor;
the positive side primary switch element comprises an NMOS transistor;
the negative side primary switch element comprises an NMOS transistor;
the positive side second node is not connected; and
the negative side second node is not connected.

27. The switched capacitor circuit of claim 25 wherein:
the center switch element comprises an NMOS transistor;
the positive side primary switch element comprises a PMOS transistor;
the negative side primary switch element comprises a PMOS transistor;
the positive side second node is connected to ground; and
the negative side second node is connected to ground.

28. The switched capacitor circuit of claim 25 wherein:
the center switch element comprises a PMOS transistor;
the positive side primary switch element comprises an NMOS transistor;
the negative side primary switch element comprises an NMOS transistor;

the positive side second node is connected to ground; and the negative side second node is connected to ground.

29. The switched capacitor circuit of claim 25 wherein:

the center switch element comprises an NMOS transistor;

the positive side primary switch element comprises an NMOS transistor;

the negative side primary switch element comprises an NMOS transistor;

the positive side second node is connected to the positive side first node; and the negative side second node is connected to the negative side first node.

30. The switched capacitor circuit of claim 25 wherein:

the center switch element comprises an NMOS transistor;

the positive side primary switch element comprises a PMOS transistor;

the negative side primary switch element comprises a PMOS transistor;

the positive side second node is connected to the positive side first node; and the negative side second node is connected to the negative side first node.

* * * * *

UNITED STATES PATENT AND TRADEMARK OFFICE
CERTIFICATE OF CORRECTION

PATENT NO. : 7,015,742 B2  Page 1 of 1
APPLICATION NO. : 10/250285
DATED : March 21, 2006
INVENTOR(S) : Ke, Ling-Wei It is certified that error appears in the above-identified patent and that said Letters Patent is hereby corrected as shown below:

Title Page

73 Assignee

Media Tek Inc.→ should read MediaTek Inc.

Signed and Sealed this

Fifteenth Day of August, 2006

JON W. DUDAS
*Director of the United States Patent and Trademark Office*